United States Patent
Heffner

(10) Patent No.: US 10,674,619 B1
(45) Date of Patent: Jun. 2, 2020

(54) POWER SOURCE WITH MAGNETIC CONNECTION

(71) Applicant: Edward Lee Heffner, Mercersburg, PA (US)

(72) Inventor: Edward Lee Heffner, Mercersburg, PA (US)

( * ) Notice: Subject to any disclaimer, the term of this patent is extended or adjusted under 35 U.S.C. 154(b) by 0 days.

(21) Appl. No.: 15/863,185

(22) Filed: Jan. 5, 2018

Related U.S. Application Data

(60) Provisional application No. 62/443,114, filed on Jan. 6, 2017.

(51) Int. Cl.
| | |
|---|---|
| *H05K 5/02* | (2006.01) |
| *H02J 7/00* | (2006.01) |
| *H01R 13/62* | (2006.01) |
| *F21L 4/08* | (2006.01) |
| *H02J 7/34* | (2006.01) |
| *H02J 7/35* | (2006.01) |

(52) U.S. Cl.
CPC ....... *H05K 5/0256* (2013.01); *H01R 13/6205* (2013.01); *H02J 7/007* (2013.01); *F21L 4/08* (2013.01); *H02J 7/345* (2013.01); *H02J 7/35* (2013.01)

(58) Field of Classification Search
CPC .... H01R 13/6205; H05K 5/0256; H02J 7/007
See application file for complete search history.

(56) References Cited

U.S. PATENT DOCUMENTS

| | | | | |
|---|---|---|---|---|
| 5,522,943 | A * | 6/1996 | Spencer | H01L 31/042 136/245 |
| 6,476,311 | B1 * | 11/2002 | Lee | H02J 7/355 136/244 |
| 8,348,678 | B2 * | 1/2013 | Hardisty | H01R 13/6205 439/39 |
| 9,190,857 | B1 * | 11/2015 | Lee | H02J 7/0042 |
| 9,490,659 | B1 * | 11/2016 | English | H02J 7/355 |

(Continued)

OTHER PUBLICATIONS

Codiy, Magnetic Laptop Power Connector, Apr 30, 2008, Instructables.com; https://www.instructables.com/id/Magnetic-Laptop-power-connector/ (Year: 2008).*

(Continued)

*Primary Examiner* — Hoa C Nguyen
*Assistant Examiner* — Keith DePew
(74) *Attorney, Agent, or Firm* — Sandy Lipkin

(57) ABSTRACT

A power outlet system utilizing magnetic polarities in concert with electrical polarities to provide a connection system that automatically "rights" itself and cannot be powered incorrectly. Negative/Positive electric points are paired with south pole/north pole magnetic points on both outputs of power and inputs to receive power that align the negative/positive polarities on the outputs and inputs and provide opposing magnetic polarities so that the two connected pieces are always oriented correctly and easily connect to each other. Specialized modules are designed to connect to the power source which can be a portable unit that utilizes solar powered batteries or a wall unit that plugs into a wall electric outlet. A specialized module can be charged from the solar powered battery unit that requires no batteries itself and can be used as an emergency back up in the event of a power outage.

8 Claims, 43 Drawing Sheets

(56) References Cited

U.S. PATENT DOCUMENTS

| | | | | |
|---|---|---|---|---|
| 9,865,903 | B1* | 1/2018 | Petrella | H01M 10/465 |
| 9,866,167 | B2* | 1/2018 | Chambe | H02S 20/30 |
| 2008/0110672 | A1* | 5/2008 | Ryan | H05K 5/0204 |
| | | | | 174/542 |
| 2012/0252231 | A1* | 10/2012 | Kall | H01R 13/6205 |
| | | | | 439/39 |
| 2012/0295451 | A1* | 11/2012 | Hyun-Jun | H01R 13/6205 |
| | | | | 439/39 |
| 2013/0328484 | A1* | 12/2013 | Villarreal | H01R 13/2421 |
| | | | | 315/127 |
| 2013/0343025 | A1* | 12/2013 | Bdeir | H01R 13/6205 |
| | | | | 361/803 |
| 2015/0093922 | A1* | 4/2015 | Bosscher | H01R 13/665 |
| | | | | 439/39 |
| 2015/0163938 | A1* | 6/2015 | Vroom | H01R 13/6205 |
| | | | | 361/807 |
| 2015/0285448 | A1* | 10/2015 | Andersen | F21L 4/00 |
| | | | | 362/205 |
| 2017/0093087 | A1* | 3/2017 | Esmaeili | H01R 12/61 |
| 2017/0093104 | A1* | 3/2017 | Powers | H01R 31/06 |
| 2017/0222457 | A1* | 8/2017 | Hijazi | G06F 1/263 |
| 2017/0229801 | A1* | 8/2017 | Underwood | H01R 13/2407 |
| 2018/0191097 | A1* | 7/2018 | Yonnet | H01R 13/6205 |
| 2018/0233852 | A1* | 8/2018 | Wang | H01R 13/521 |
| 2019/0168622 | A1* | 6/2019 | McRoberts | B60L 50/15 |

OTHER PUBLICATIONS

Kedar Nimbalkar, Easiest Magnetic Power Connector, May 6, 2015, Instructables.com; https://www.instructables.com/id/Easiest-Magnetic-Power-Connector/ (Year: 2015).*

* cited by examiner

US 10,674,619 B1

POWER SOURCE WITH MAGNETIC CONNECTION

REFERENCE TO PRIOR APPLICATION

This application claims priority of the provisional patent application 62/443,114, filed Jan. 6, 2017 by Edward Lee Heffner entitled CAMPING COMPANION COMPLETE.

BACKGROUND OF THE INVENTION

Field of the Invention

The field of this invention relates generally to the field of power sources and more specifically toward outputs that attach to modules that require power wherein the outputs are magnetic having a north pole and south pole and wherein the modules receiving the power are also outfitted with magnetic pole connectors that oppose and therefore attach to the outputs and receive electrical power and attach in such a way as that incorrect attachment is impossible.

Description of the Prior Art

Electricity powers our lives more and more with the advancement of technology. Electricity is supplied through coal, nuclear power, the sun and electrolysis in batteries. Typically anything requiring electricity is either plugged into an electrical outlet, which can be powered through solar power, coal-burning or nuclear reactions that take place at a power generating facility off-site.

For portable power, i.e., powering on electrical devices where no outlet to an off-site power generating plant is available, batteries are used. These batteries can have a finite life, i.e., once the electricity is used up, the battery is thrown into landfills and new batteries are purchased. This obviously causes an environmental concern, and rechargeable batteries have been developed that plug into electrical outlets to re-charge. This solution still utilizes the off-site power plant and often times suffers from short battery life.

Some devices don't use replaceable batteries, such as smart phones and tablets, but rather need to be recharged using a charging cord that connects to another power source, which is usually an electrical outlet, although it can also charge off of car batteries or other batteries. These cords break frequently and get lost and are the cause of frustration because of this.

Additionally, when using batteries, typically there is more than one battery needed and there are two directions to place the batteries corresponding to the negative and positive charge. Each device that needs new batteries needs to be visually inspected to determine the direction in which to place the batteries. This is often done incorrectly and can be another source of frustration.

It is an object of the instant invention to provide a charging means for electrical devices that does not require cords.

It is yet another object of the instant invention to provide a charging means wherein orientation of the charge cannot be performed incorrectly as the invention itself will always "right" the direction of the charge.

It is yet another object of the instant invention to provide a wall-mounted, electrical-outlet charging electrical output for electrical devices.

It is yet another object of the instant invention to provide a portable battery that is solar powered that can power any number of electrical devices using modules designed for those devices utilizing the charging means wherein orientation of the charge cannot be performed incorrectly as the invention will always "right"' the direction of the charge.

Finally, it is the ultimate object of the instant invention to keep used batteries out of landfills.

SUMMARY OF THE INVENTION

The basic embodiment of the present invention teaches an electrical connection system comprising: an output array from a power source wherein said output array includes a first connector that is positively electrically charged and contains a south pole magnet and a second connector that is negatively electrically charged and contains a north pole magnet; an input array on a modular device, said modular device needing electricity to operate wherein said input array includes a first connector that is positively electrically charge and contains a north pole magnet to connect with said first connector on said output array and a second connector that is negatively electrically charged and contains a south magnet to connect with said second connector on said output array.

The above embodiment can be further modified by defining that said modular device is taken from the group comprising: security motion detector module; fire starting module; cigarette lighter module; AM/FM radio module; mp3 module with built-in speaker; USB port module; super capacitor module for high voltage current devices which can be used as a stand alone during emergency power backup; multiplexer module for using several modules at a time; LED reading module; battery charging module for rechargeable AAA, AA and C batteries; slipper smart phone module; 12 vdc module; clock module with alarm, date, time and indoor temperature; solar panel module; and compass module.

The above embodiment can be further modified by defining that said output connectors are affixed to a wall mounted device that is connected via a cable to electricity via electrical outlet wherein said wall mounted device further comprises a second set of output connectors arrayed below said first set wherein said second set of output connectors contains a north pole magnet that is not electrically charged positioned directly below the south pole positively electrically charged connector and a south pole magnet that is not electrically charged positioned directly below the north pole electrically charged connector.

The above embodiment can be further modified by defining that an LED light is affixed to said wall mounted device.

The above embodiment can be further modified by defining that a power link connector is affixed to said wall mounted device to allow connection to further wall mounted devices.

The above embodiment can be further modified by defining that power is provided to said output connectors through a portable device wherein said output connectors are affixed to said portable device and rechargeable batteries are housed in the interior of said portable device wherein said batteries are solar powered.

The above embodiment can be further modified by defining that said portable power device further comprises a removable head that is powered by said rechargeable batteries.

The above embodiment can be further modified by defining that the types of removable heads are taken from the group comprising: an LED lantern; red LED lights to provide light for night hunting or to speed up the healing of wounds; UVC LED lights to be used along with a stainless steel dish into which water can be contained wherein the UVC LED lights are used to sterilize the water; LED light heads to warm up foods and liquids; a fan head; a black LED light head; and a facial LED module for wrinkle reduction.

The above embodiment can be further modified by defining that further output connectors provide non-battery charging for a super capacity module with adjustable output.

The above embodiment can be further modified by defining that said connectors are used to power a cell phone slipper module containing a wire that connects to a smart phone.

The above embodiment can be further modified by defining that specialized discs are provided to adjust amperage and voltage on said module.

The above embodiment can be further modified by defining that specialized discs are provide to power on the device, select voltage or to select amperage.

BRIEF DESCRIPTION OF THE DRAWINGS

For a better understanding of the present invention, reference is to be made to the accompanying drawings. It is to be understood that the present invention is not limited to the precise arrangement shown in the drawings.

DETAILED DESCRIPTION OF A PREFERRED EMBODIMENT

Figure 1:
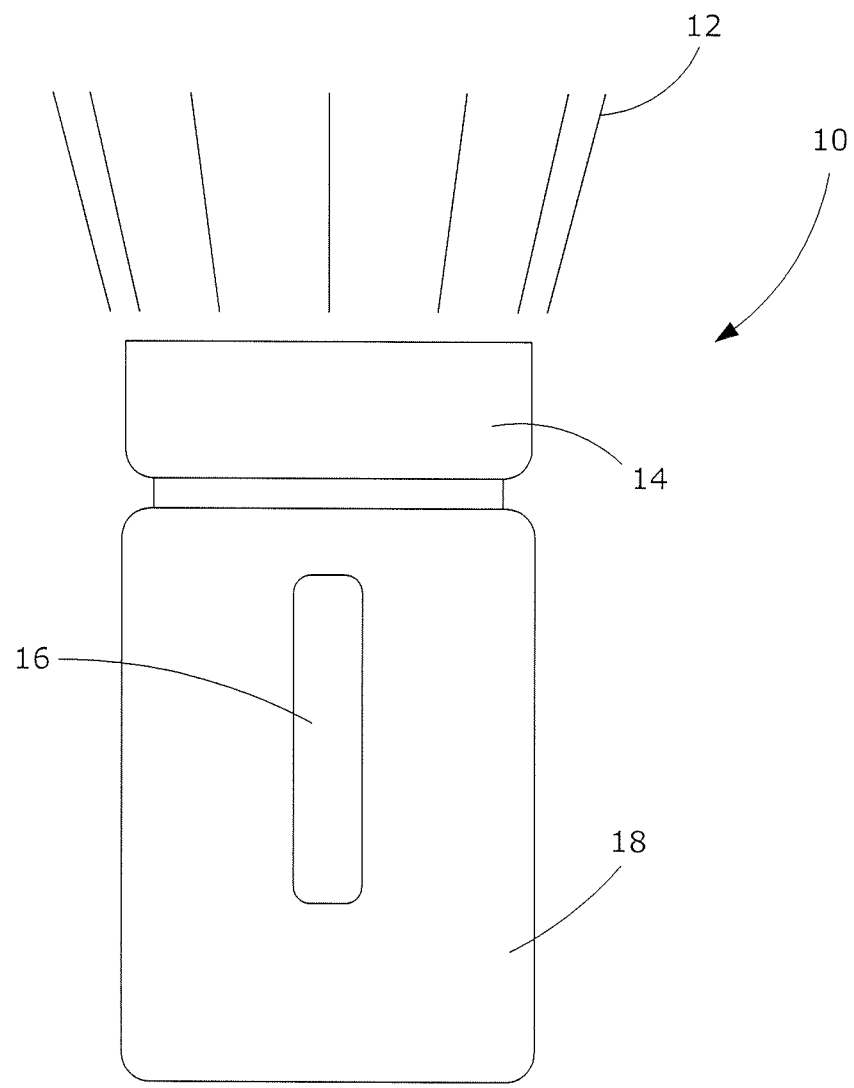
FIG. 1 is a top view of the portable power device of the instant invention.
Figure 2:
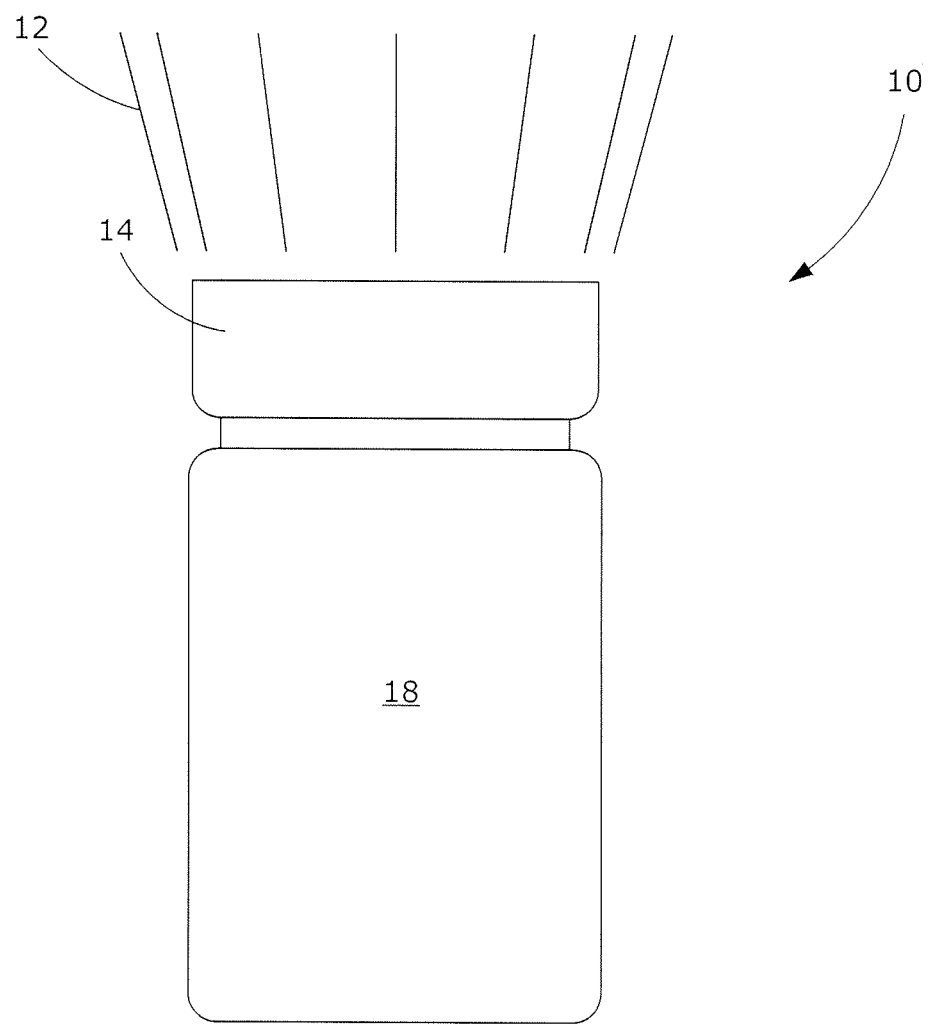
FIG. 2 is a bottom view of the portable power device of the instant invention.

The following is a list of the reference numbers for easy reference when referring to the drawings:

10 portable power unit embodiment
12 emitted light
14 removable, screw-on head for portable power unit
16 handle for portable power unit
18 body of portable power unit
20 voltage select points on portable power unit
21 amperage select points on portable power unit
22 power on/off points on portable power unit
24 output connector points on portable power unit
26 permanent solar panel on portable power unit
28A electronic configuration of output connector points on portable power unit
28B magnetic configuration of output connector points on portable power unit
29 NIMH batteries
30A positive electricity point
30B negative electricity point
32A magnetic south pole
32B magnetic north pole
34 schematic diagram—second side of portable power unit—outside
35 schematic diagram—second side of portable power unit—inside
36 magnetic disconnect from inside of portable power unit
38 amperage select (inside)
40 voltage select (inside)
42 schematic diagram—first side of portable power unit—outside
43 schematic diagram—first side of portable power unit—inside
44 top four cell battery configuration—illustrative module
46 bottom four cell battery configuration—illustrative module
48 wall mounted unit embodiment
49 slave unit
50 double-sided tape
52 wall
54 face of wall mounted unit embodiment
56A magnetic connection point on wall unit embodiment electrically positive, south pole magnetically
56B magnetic connection point on wall unit embodiment electrically negative, north pole magnetically
56C magnetic connection point on wall unit embodiment north pole magnetically
56D magnetic connection point on wall unit embodiment south pole magnetically
58 steel cable
60 plug in
62 wall outlet
64 power link
65 LED light
66 retainer ring/guard for magnets on wall mount embodiment
68 permanent magnet on wall mount embodiment
70 replaceable magnet on wall mount embodiment
72 screw
74 modular device (illustrative)
76 positive electrical point, north pole magnetic point on modular device
78 negative electrical point, south pole magnetic point on modular device
80 cell phone slipper module
82 slipper bumper
84 recessed area for phone in cell phone slipper module
86 connecting wire on cell phone slipper module
88 switch for voltage select (knob/disc) or power on/off
88A switch for amperage select—portable power unit
90 first south pole magnetic point on switch
92 second south pole magnetic point on switch
94 lever on voltage select switch
94A lever on amperage select switch
96 PPTC dimming disc
98 lever on PPTC dimming disc
99 copper etched away point
100 first south pole magnet on PPTC dimming disc
101 solder joints
102 second south pole magnet on PPTC dimming disc
104 resistors on PPTC dimming disc
106 pivot magnet on portable power unit embodiment for voltage select
108 high voltage magnet on portable power unit embodiment for voltage select
110 medium voltage magnet on portable power unit embodiment for voltage select
112 low voltage magnet on portable power unit embodiment for voltage select
114 extension cord
116 output connector on extension cord
118 window
120 sun
122 secondary solar panel
124 modular device magnet pair
126 table
128 ground
130 connecting cable to interior of portable power unit embodiment
132 constant output on portable power unit
142 schematic for slave power links
144 ten point battery connection inside of portable power unit
146 connector to cell phone battery
148 super capacitor module with adjustable output
150 CAP1
150A Point A
152 CAP2
152A Point B
154 CAP3
154A Point C
156 CAP4
156A Point D
158A positive output connector on super capacitor module with variable output—Point F
158B negative output connector on super capacitor module with variable output—Point E
160A negative input connector on super capacitor module with variable output, rear view
160B positive input connector on super capacitor module with variable output, rear view
162 disc one—black, low amperage 6 vdc
164 disc two—green, high amperage 6 vdc
166 disc three—white, high amperage 12 vdc
168 north pole top
170 south pole top 172 north pole bottom
174 south pole bottom
176 first connection
178 second connection
180 module connectors
182 south pole top
184 north pole top
186 north pole bottom
188 south pole bottom
190 top bank
192 bottom bank
194 illustrative disc
196 amperage select
198 voltage select
200A first south pole magnet on voltage select switch
200B second south pole magnet on voltage select switch Turning to the drawings, the preferred embodiment is illustrated and described by reference characters that denote similar elements throughout the several views of the instant invention.

The preferred embodiment provides for a portable power unit 10 that can be taken anywhere without the need for powering through an electrical outlet as it includes a nickel battery that is solar charged. The nickel battery is known to hold its charge after long periods of time between uses and so it was incorporated into the unit to provide for the most longevity per charge. The portable power unit embodiment can charge any number of modular components that are formatted to receive the charge. Furthermore, the portable power unit embodiment also has a removable screw-on head that can be replaced with different heads or the heads can extend from the portable power unit embodiment for use outside of the portable power unit embodiment through connection to an extension cord.

An alternate embodiment utilizes a wall unit with the same magnetic connecting principle found in the portable power unit embodiment. The wall unit embodiment, however, does not include a battery, is plugged into a wall socket and does not need an on/off switching mechanism. Below, we will describe the various elements of the invention in the following sequence: 1) the magnetic/electric connection common to all embodiments; 2) the portable power unit embodiment; 3) the removable head portion of the portable power unit embodiment; 4) the modular attachments for all embodiments; 5) the specialized module that is used as a super capacitor module with adjustable output; 6) the power on/off mechanism for the portable power unit embodiment; 7) the voltage selector for the portable power unit embodiment; 8) the amperage selector for the portable power unit embodiment; and 9) the wall mount embodiment.

The preferred portable power unit embodiment is illustrated in FIGS. 1-7B, 8-9, 16A-19, the alternate wall mount embodiment is illustrated in FIGS. 10-13B, 15A-15B, 19 and illustrative modular components are illustrated in FIGS. 7C, 13A-15B, 17, 20A-20L. The removable head on the portable power unit embodiment is illustrated in FIG. 18.

1) The Magnetic/Electric Connection Common to all Embodiments

At the crux of both described embodiments and any contemplated modules to those embodiments is the electrical and magnetic connection charging points. Both physical embodiments provide power inputs that are then transferred to modules that are connected thereto. In the case of the portable power unit embodiment, the source of power comes from four NIMH solar powered batteries inside that unit that are rechargeable by the unit. In the case of the wall mount embodiment, power is supplied through electrical current in an electrical outlet.

The contacts between the power source and the modules or heads receiving the power are configured with magnets so that it is impossible to orient the charging components incorrectly. The use of the magnets with electricity provides a means of electrical charge that requires no batteries, no rechargeable batteries and no cords to break or get tangled. The contacts are polarized magnetic electrical connectors and are replaceable. A separator makes it impossible for the system to short out. At least one magnet in the system has a protective ring that protects and prevents short circuit across all magnets. Plastic extenders can also be used to protect the magnets in the event a module is dropped.

In the system, the output power source is composed of essentially a positively charged electric end that is also polarized to the south pole of a magnet paired with a negatively charged electric end that is also polarized to the north pole of a magnet. The interchangeable modules and heads that get connected to the power source for charge line up so that the positive electric charge has a north pole magnet and the negative electric charge has a south pole magnet. Because of this configuration, the positive ends line up with each other and are attracted to each other due to the opposite polarities between the magnets.

Figure 7A:
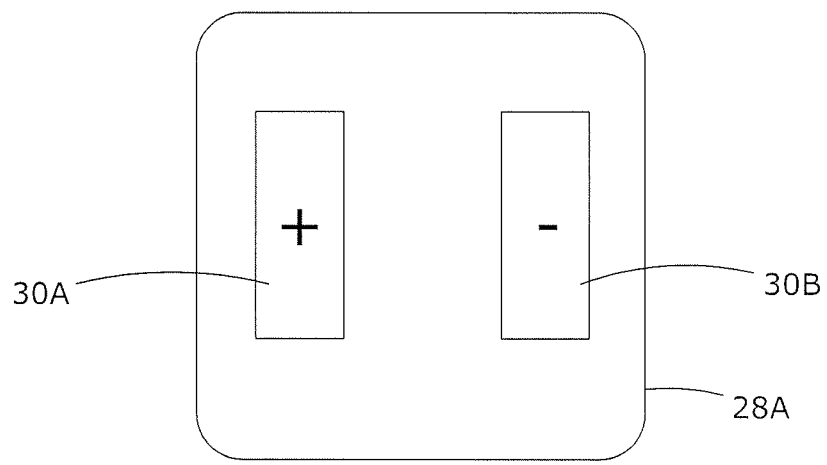
FIG. 7A is a schematic view of the power out connectors, top half, of the instant invention.
Figure 7B:
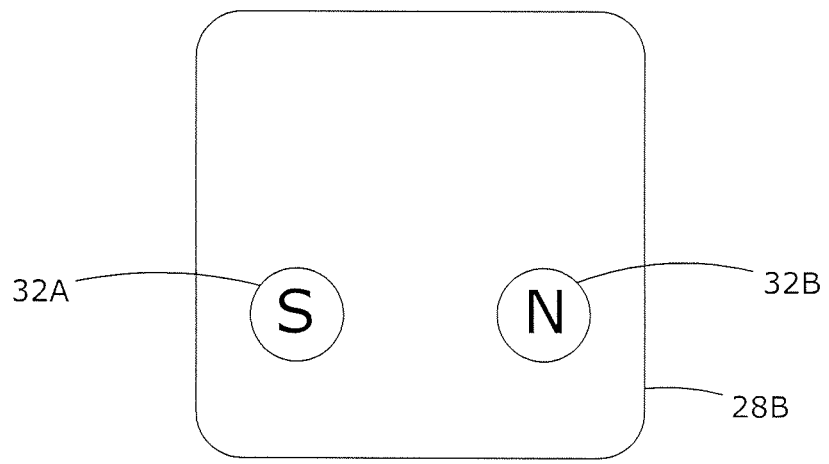
FIG. 7B is a schematic view of the power out connectors, bottom half, of the instant invention.

The connection system is illustrated in FIGS. 7A-7C and 13A-14B. In FIG. 7A we see illustrated schematically the electrical polarity 28A on a pair of output connectors. The left side (viewing straight on) is positively charged electrically 30A while the right side is negatively charged electrically 30B. In FIG. 7B we see the magnetic polarity 28B per side on a pair of output connectors. The left side is a magnetic south pole 32A and the right side is a magnetic north pole 32B. A meter may be needed during assembly to ensure that the polarity of the magnets is correct, which is critical to the use of the invention.

Figure 13A:
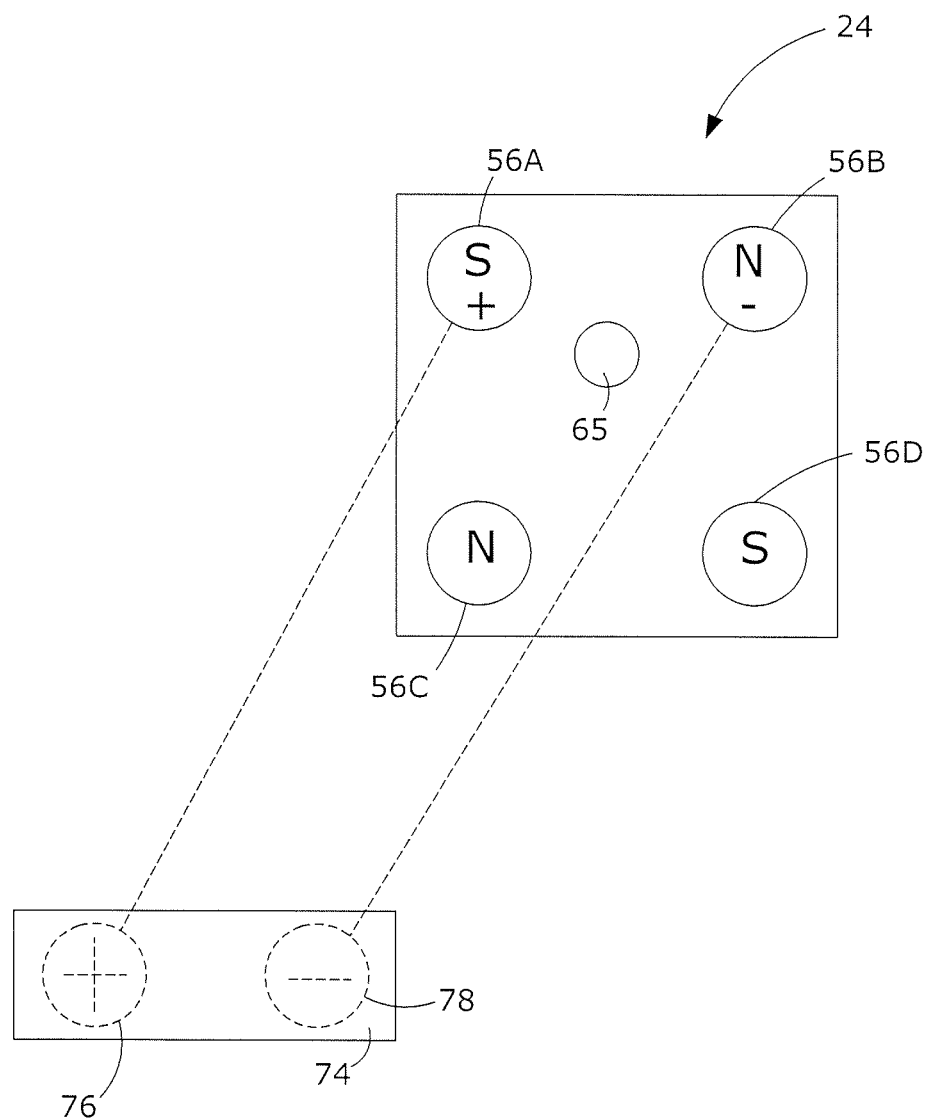
FIG. 13A is a schematic representation of how an illustrative module attaches to the face of the wall mount embodiment of the instant invention wherein the module is in the ON position.
Figure 13B:
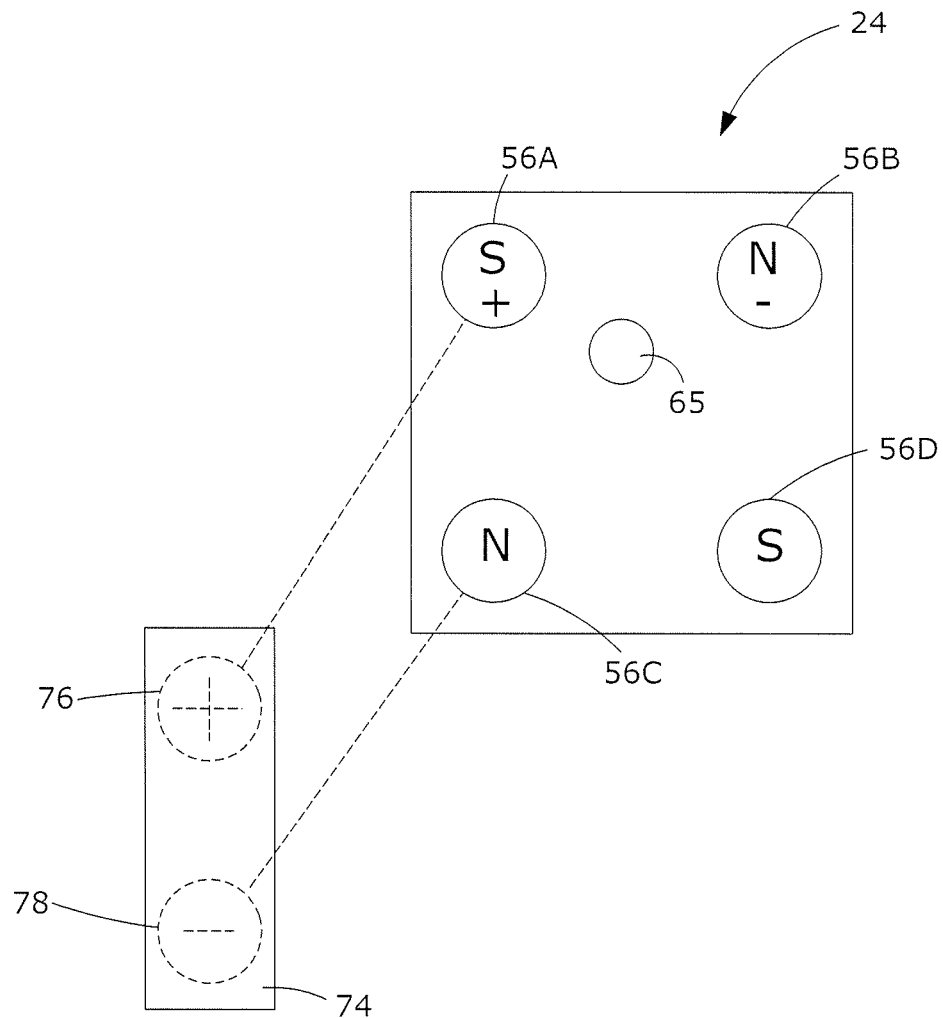
FIG. 13B is a schematic representation of how an illustrative module attaches to the face of the wall mount embodiment of the instant invention wherein the module is in the OFF position.

In FIGS. 13A and 13B we see a configuration where the output source has four magnets. This is the wall mount embodiment configuration. The bottom two magnets are not electrically charged and are used to hold connected modules in place when in the OFF position (more on that below). In these figures, FIG. 13A shows the module 74 to be connected going in at the horizontal ON position while FIG. 13B shows the module as it is turned vertical into the OFF position. The wall mount embodiment 48 output has four connection points 56A, 56B, 56C, 56D and the connecting module 74 has two 76, 78. On the wall mount 48, starting from the upper left side (looking straight on), we have a top connector 56A that is positively electrically charged with a south pole magnet. To the right of that is a negatively electrically charged connector 56B that has a north pole magnet. Below the positive charge is a north pole magnet 56C with no charge which is paired to its right by a second magnet 56D with a south pole magnet without electrical charge.

The module 74 to be connected has a positively electrically charged north pole magnet 76 that connects to the positively charged south pole output 56A and a negatively electrically charged north pole magnet 78 that connects to the negatively charged north pole output 56B. Because the magnetic polarities are reversed, there is only one way they can connect. Attempts to connect them with the wrong electric polarity will be met with magnetic repulsion due to the polarity of the magnets. FIG. 13A shows the attachment of the module 74 in the ON position.

Figure 14A:
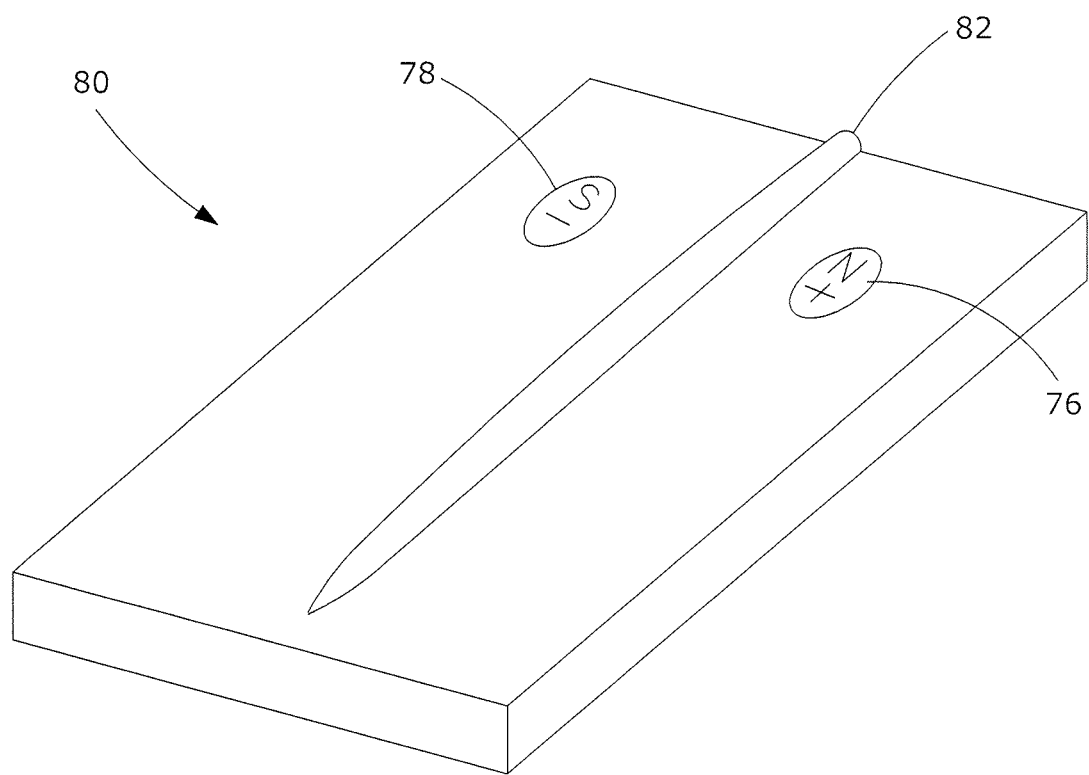
FIG. 14A is a rear isometric view of the cell phone slipper module (illustrative).
Figure 14B:
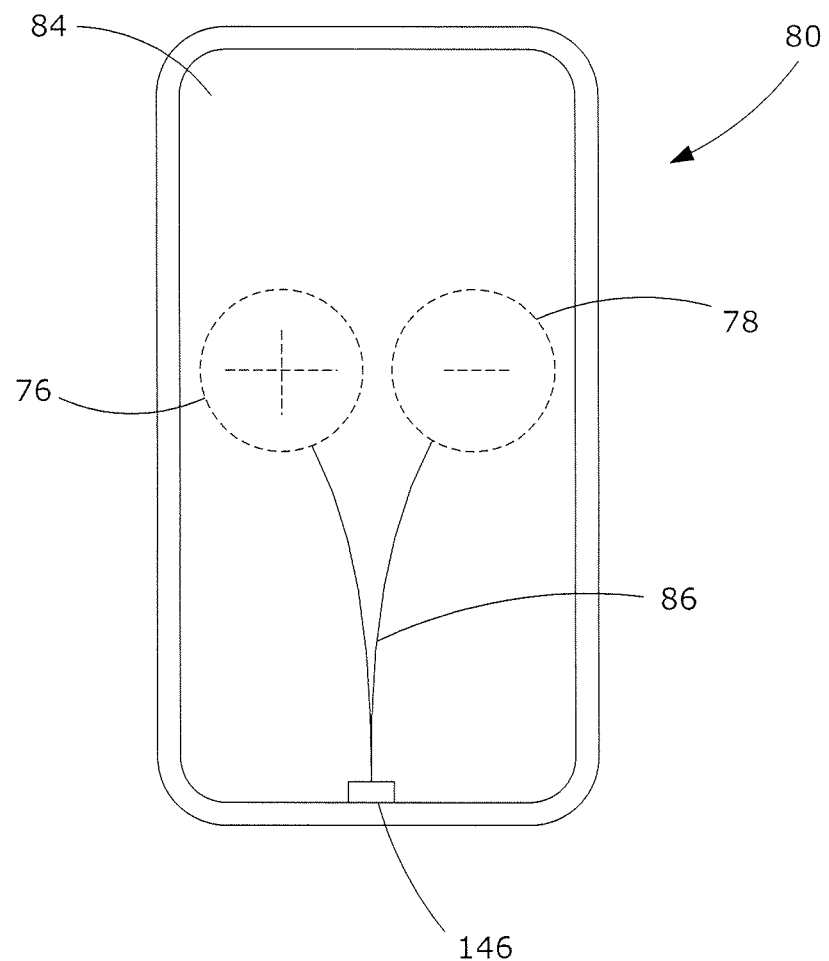
FIG. 14B is a front view of the cell phone slipper module (illustrative).

FIG. 13B is similar to FIG. 13A, but note that the module 74 is not in a horizontal position. In this configuration, the positive electrically charged north pole magnetic pole 76 still connects to the positive electrical south pole magnet connection 56A on the wall unit 48, but now the negatively electrically charged north pole magnet on the module attaches to the bottom north pole magnet 56C that has no electrical charge, essentially opening the circuit and stopping the flow of electricity therethrough. FIGS. 14A-14B show an illustrative module, in this case, the cell phone slipper module 80 that is a specialized module just for charging cell phones. FIG. 14A shows the connection side with the connectors 76, 78 separated by a protective bumper 82 in the event the slipper is dropped. The opposite side of the slipper 80 is shown in FIG. 14B where the connection points can be seen in dashed lines with a connecting wire 86 that connects to the battery on a cell phone at the bottom connecting point 146. The cell phone sits in the recessed space 84 of the slipper 80.

2) The Portable Power Unit Embodiment

The portable power unit embodiment of the instant invention is illustrated in FIGS. 1-6, 8-9, 16A-16B and 17-18. The portable power unit 10 is something that can be used when power goes out, when there is no other source of power, such as when camping or hunting or any other time that power may be needed or desired where there is no electrical grid providing easily accessible power. FIGS. 1-6 show the outer look of the device. The unit 10 has a main body portion 18 inside which can be found the rechargeable NIMH batteries 29 and the magnets along with electronics that allow for charging of the battery that can also be utilized outside of the unit with the extension cord accessory (described below). On the top of the device 16 is a handle for easy carrying. At the front of the device is a removable screw-on head 12 that has multiple functionality that will be more fully described below.

Figure 3:
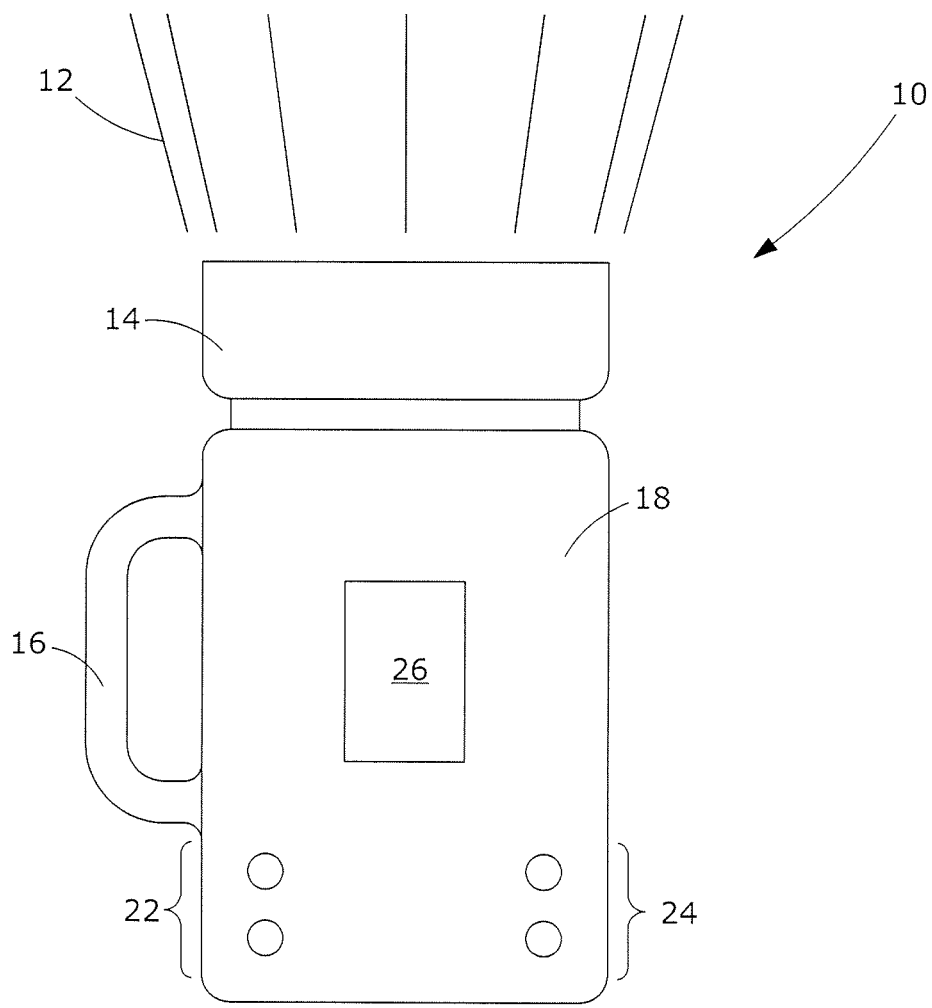
FIG. 3 is a first side view of the portable power device of the instant invention.

On the sides of the unit 10 are output connectors of varying types and functions along with a permanent solar panel 26 on one side. The permanent solar panel 26 receives energy from the sun to charge the batteries inside. Modular secondary solar panels can also be added to an output connector for faster charging. The sides of the unit 10 are also shown schematically in FIG. 8 and FIG. 9. FIG. 3 corresponds to FIG. 9 and FIG. 4 corresponds to FIG. 8. Looking at FIGS. 4 and 8, we see near the screw-on head 14 is a first set of output connectors 24. Near the handle 16 is the constant output connectors 132 for the super capacitor module with adjustable output 148 (more on that below) and cell phone slipper module already discussed (See FIGS. 14A-14B). These two modules need higher outputs and this output is on the portable unit 10 for these specific modules and any more that may be developed that likewise need the higher output. Near the rear end of this side of the unit 10 are voltage select outputs 20 and the amperage select outputs 21 (more on these below).

Figure 9:
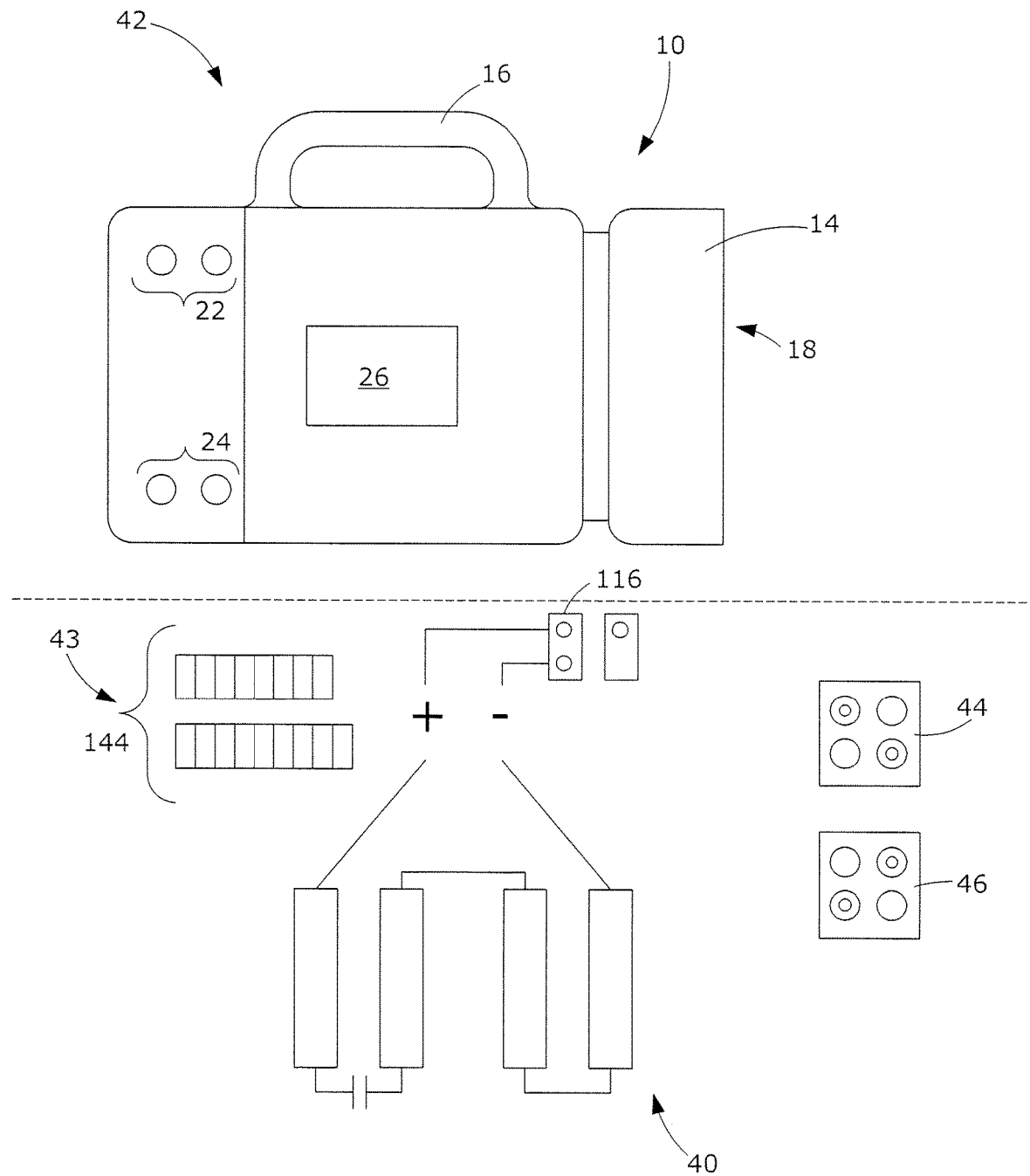
FIG. 9 is a schematic representation of the electronics and magnets in the first side of the portable power device of the instant invention.
Figure 10:
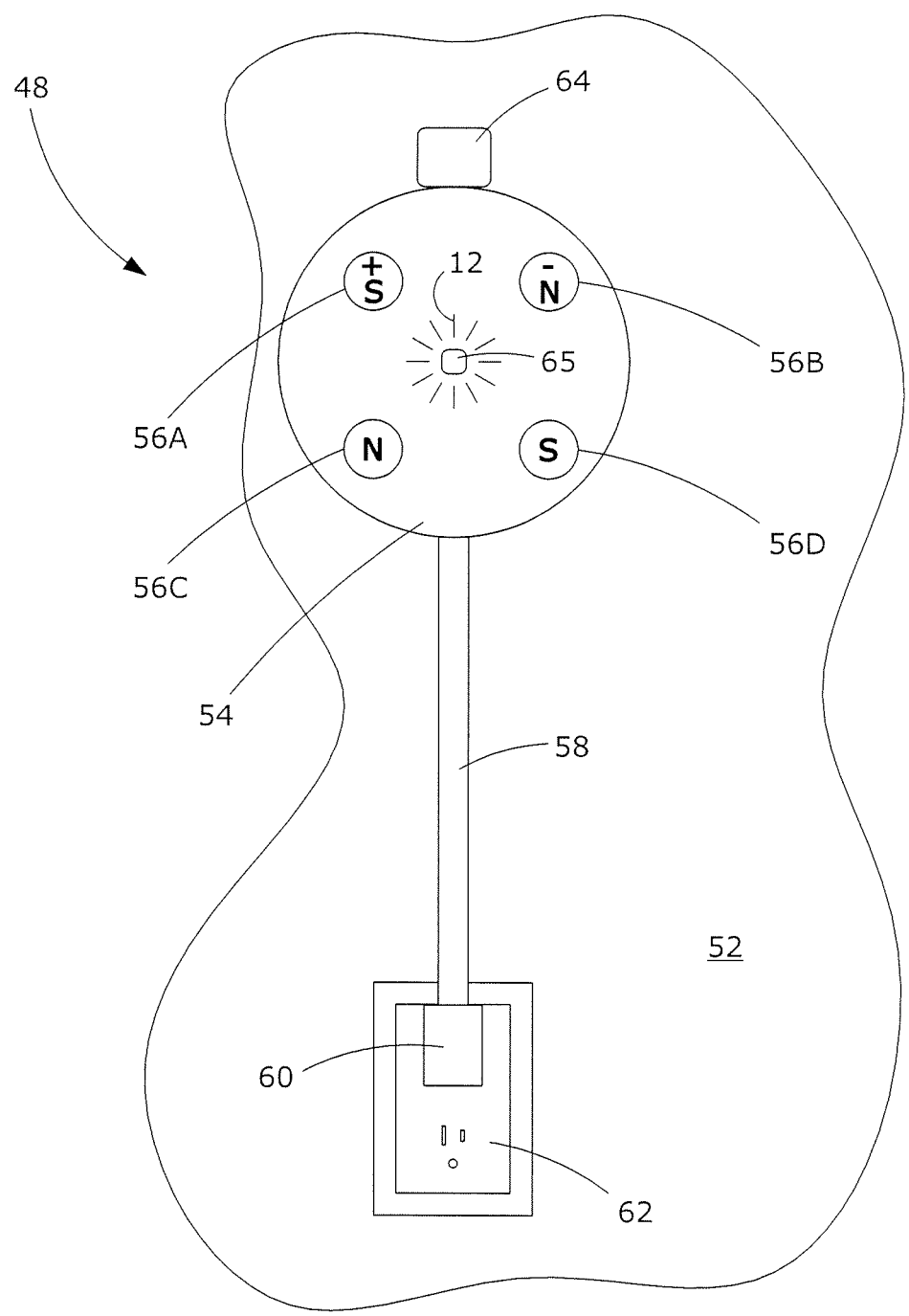
FIG. 10 is a front view of the wall mount embodiment of the instant invention.
Figure 11:
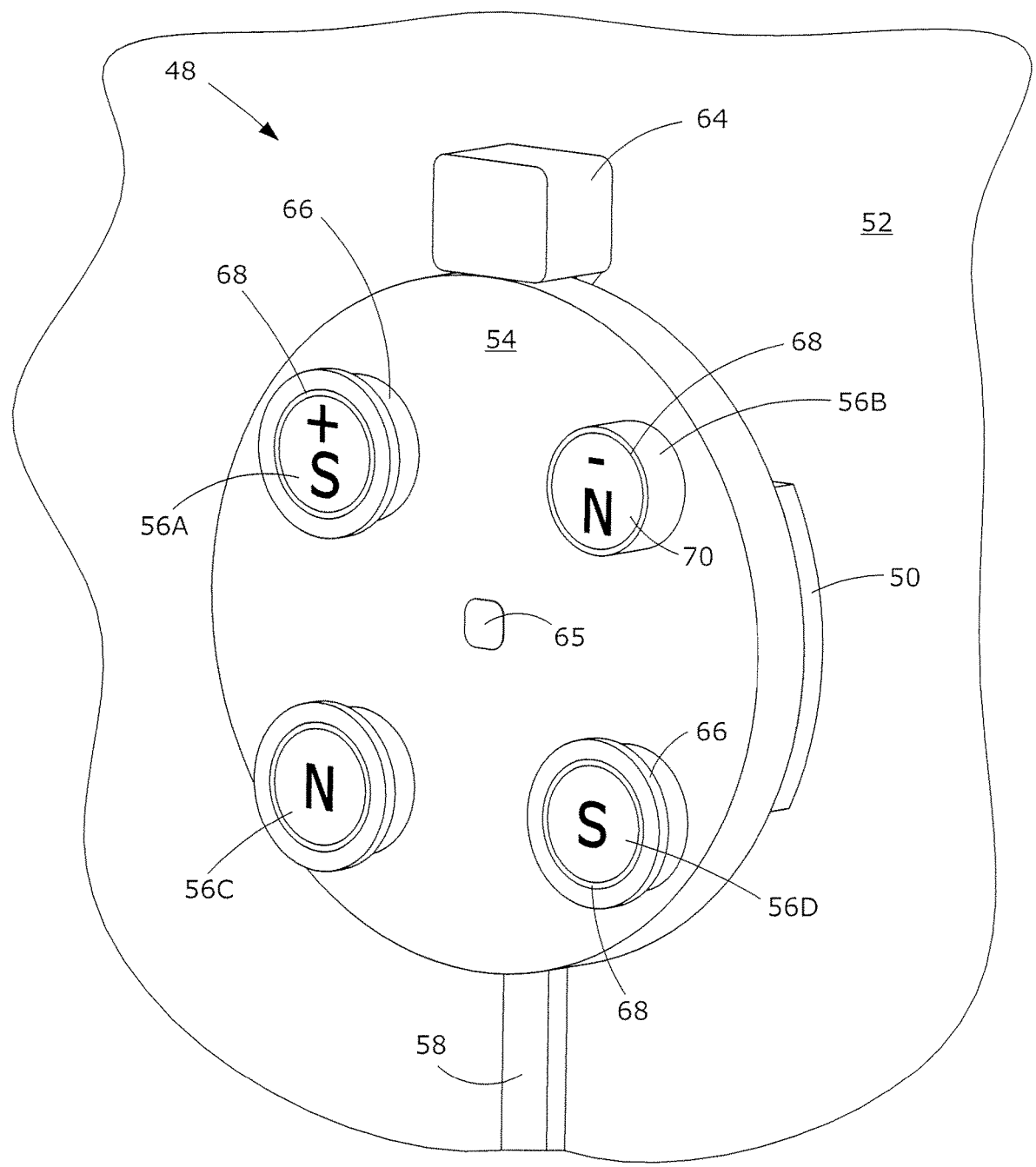
FIG. 11 is a close up isometric view of the wall mount embodiment of the instant invention.
Figure 12:
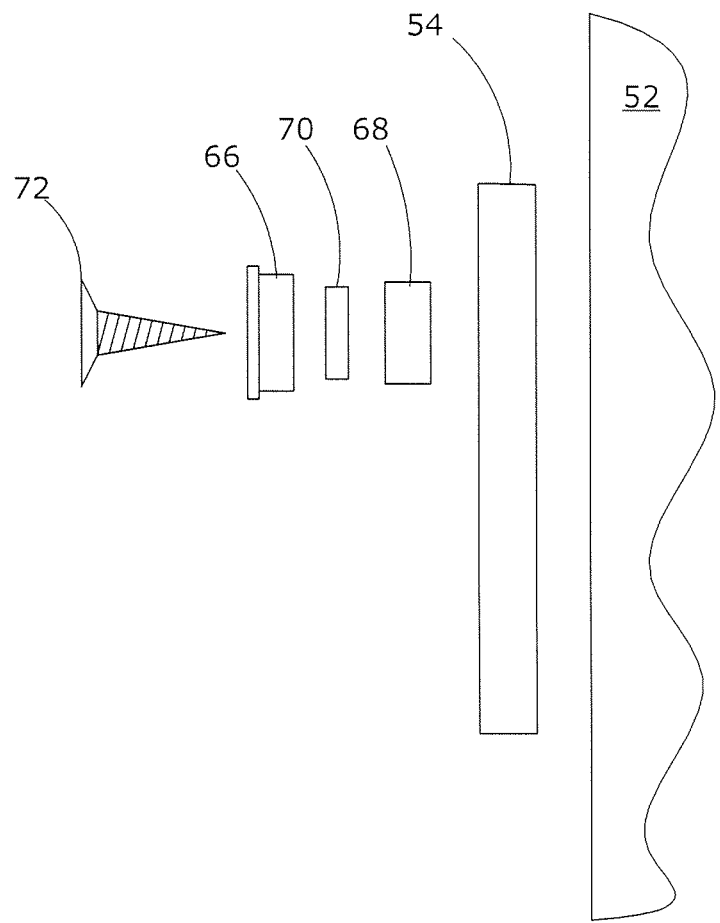
FIG. 12 is a side exploded view of component parts of an illustrative magnetic connector for the wall mount embodiment of the instant invention.

The other side of the unit 10 is shown in FIGS. 3 and 9. This side houses the permanent solar panel 26, the magnetic on/off switch 22 (more on that below) and a second pair of output connectors 24. Having output connectors 24 on either side of the unit 10 allows for dual module powering as well as a means for putting the secondary solar panel charger 122 thereon to speed up charging.

FIGS. 16A-16G show the various means of powering on the portable power unit 18 as well as the super capacitor module with adjustable output 148, choosing the voltage and choosing the amperage, which will be expanded upon below.

Figure 17:
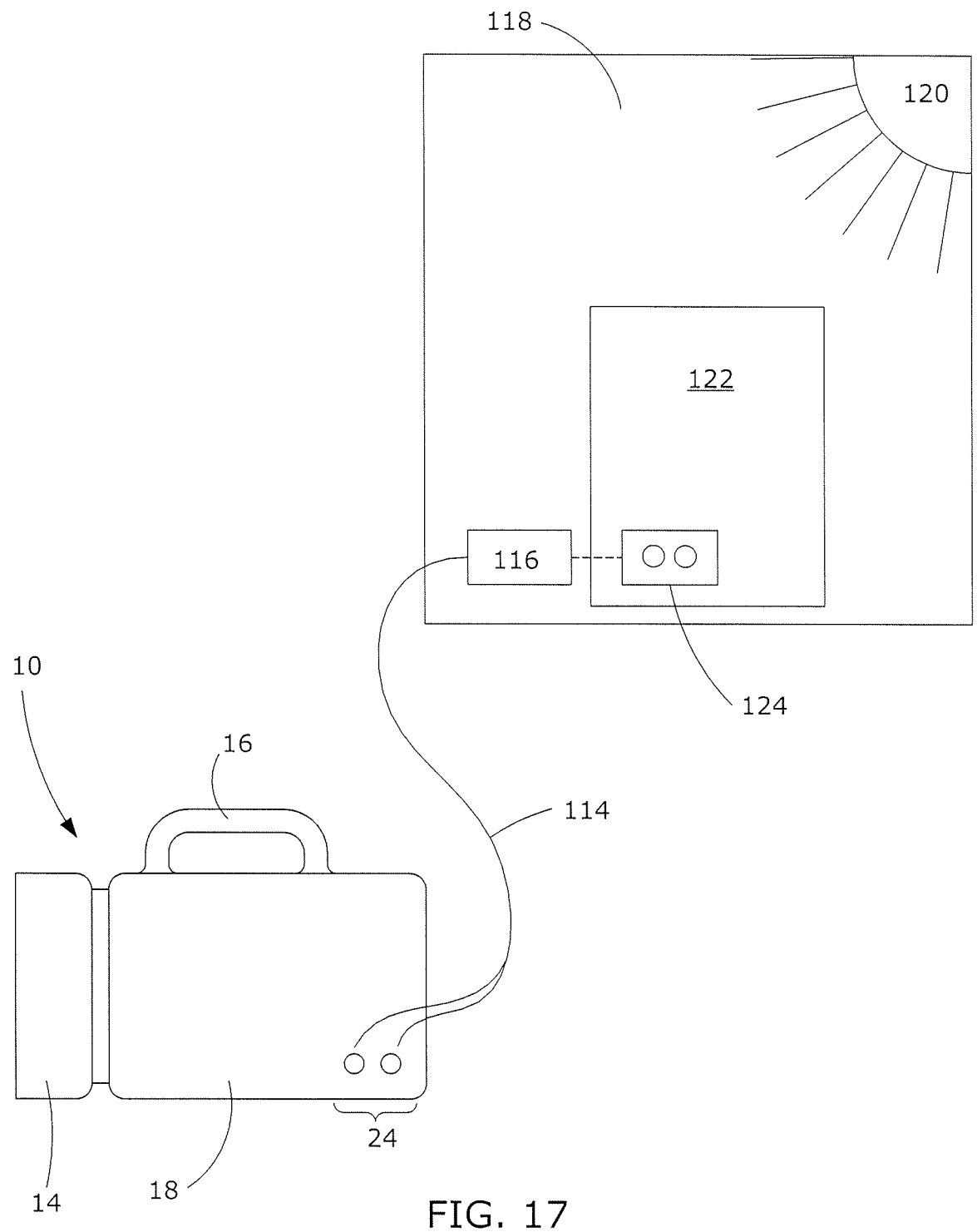
FIG. 17 is an illustrative depiction of the extension cord aspect of the portable power device embodiment of the instant invention.
Figure 18:
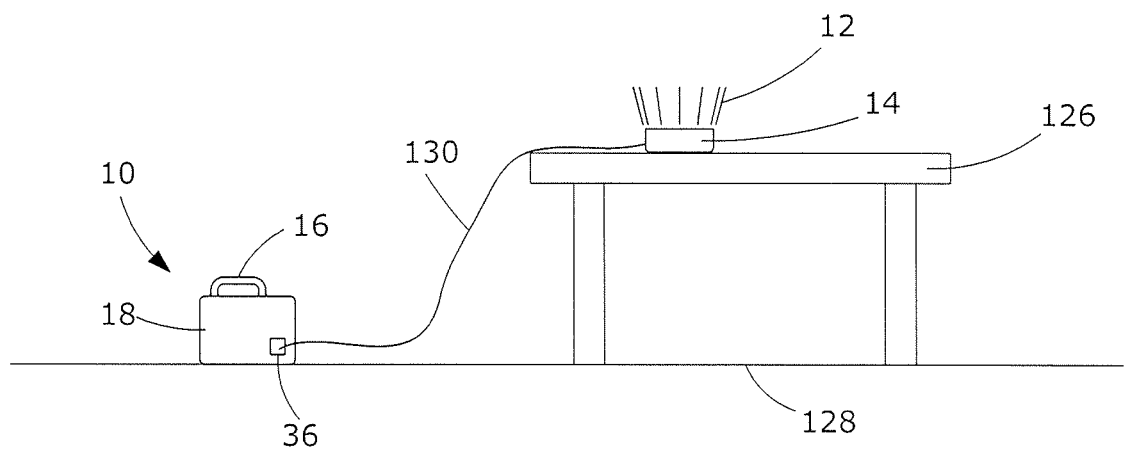
FIG. 18 is an illustrative depiction of the disengaged removable head aspect of the portable power device embodiment of the instant invention.

FIG. 17 shows an illustrative example of how an extension cord module 114 can be connected to one set of connection outputs 24 on the portable unit 10 so that the module to be used, in this case the secondary solar panel module 122, which has input connectors 124 thereon can be connected by a second set of output connectors 116 at the end of the extension cord 114. In this case, the secondary solar panel 122 is affixed to a window 118 with sun 120 exposure to allow for charging at a distance removed from the unit 10 itself.

Another feature of the portable power unit 10 is the removable screw-on head 14 that allows for a secondary means of power output that is flexible with any number of heads for different purposes. This is illustrated in FIG. 18. The unit's 10 head 14 is screwed off in this illustration with the unit 10 on the ground 128 and the head removed to another surface, in this illustration, a table top 126. The head has its own input connector at the end of an electrical wire 30 that is attached inside of the unit 18 to magnetic electrical outputs 36. In this use, the light 12 emanating from the head 14 can be oriented upward due to its placement on the table 126 away from the unit 10.

In the portable power unit 10, the defining features are the polarized magnetic electronic output connectors 24 for the modules 74; the polarized magnetic disconnect connector 36 for the screw-on heads 14; the magnetic electronic on/off switch 22 (discussed below); the magnetic electrical PPTC dimming disc 96 (discussed below); and the magnetic electrical voltage and amperage select disc 88 (discussed below).

The screw-on heads 14 are made of polycarbonate to protect the lenses on the various heads in the event of a drop. Screw-on heads to be discussed below. The batteries inside of the unit 10 can be replaced as needed, which is typically around every seven years due to the NIMH battery type chosen. There is a ten point connector 144 inside of the unit 10 that allows for easy battery replacement. (See FIG. 9).

3) The Removable Head Portion of the Portable Power Unit Embodiment

FIG. 18 (discussed above) shows an illustrative example of this feature of the portable power unit 10. The mechanism for the powering of the removable heads 14 is discussed in the section defining the portable power unit 10 above. Here we outline the various types of accessories that can be used to take advantage of this feature. To use the portable power unit as a lantern, the straight LED head is used. To use as an ambient light, the head 14 can be screwed off and placed upward. Red LED lights can also be used to provide light for night hunting or to speed up the healing of wounds. UVC LED lights can be used along with a stainless steel dish into which water can be contained wherein the UVC LED lights are used to sterilize the water. Likewise the dish could be used with the non-UVC LED light heads just to warm up what is in the dish, like fluids or another vessel, such as a cup or bowl, containing fluids or foods, like MREs. Other heads contemplated include a fan head, a black LED light head and a facial LED module for wrinkle reduction.

4) The Modular Attachments for all Embodiments

Modular attachments can be attached to either the portable power unit 10 embodiment described in detail above or the wall mount embodiment 48 described in detail below. The connecting principle is the same in both embodiments.

Figure 7C:
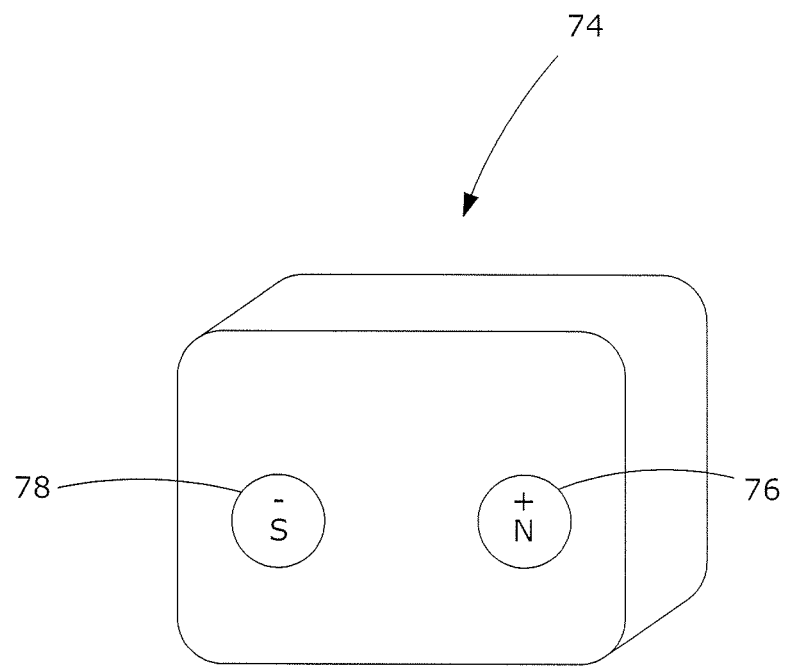
FIG. 7C is an isometric rear view of a modular device input connectors, illustrative.
Figure 15A:
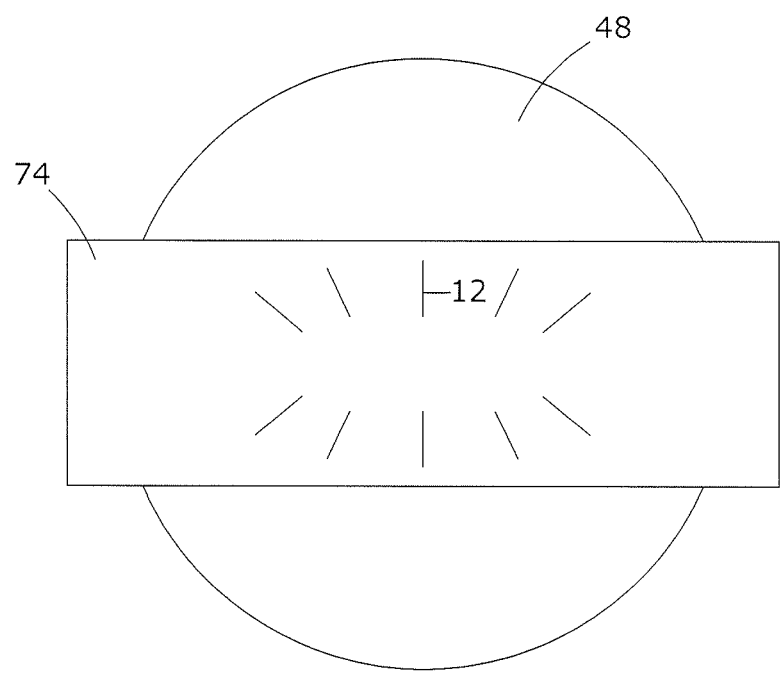
FIG. 15A is a front view of an illustrative module device connected to the wall mount embodiment of the instant invention—in the ON position.
Figure 15B:
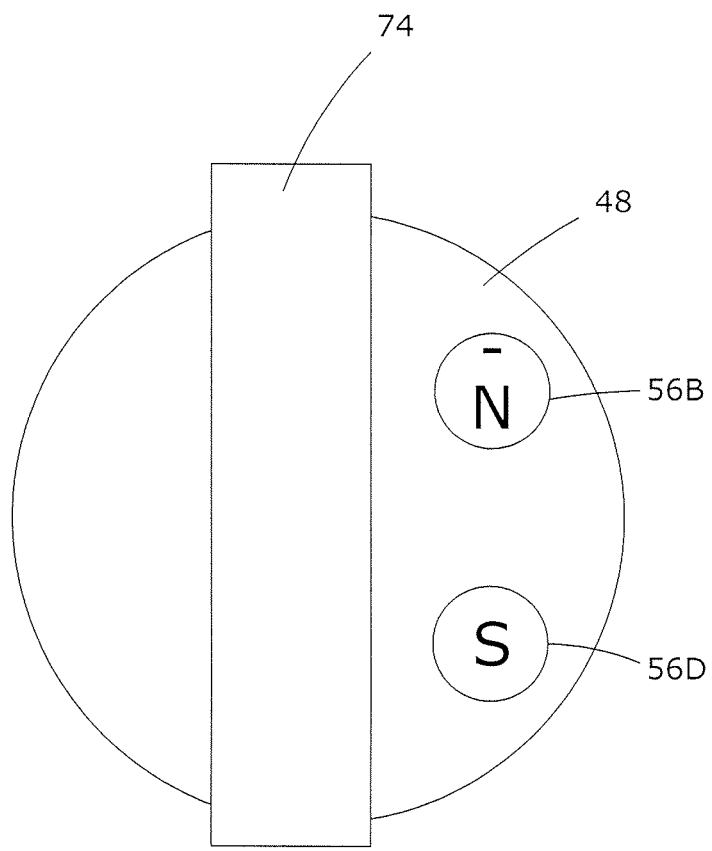
FIG. 15B is a front view of an illustrative module device connected to the wall mount embodiment of the instant invention—in the OFF position.

The modular attachments are illustrated in FIGS. 7C, 13A-15B and 17. FIG. 7C is an illustrative example of the back of a generic module 74 showing the polarity of electric and magnetic properties discussed above. FIGS. 13A-13B show the different orientations for ON and OFF in the wall mount embodiment 48. FIGS. 14A-14B illustrate the cell phone slipper embodiment 80. FIGS. 15A-15B show it on the wall mount embodiment 48 in the ON and OFF positions, respectively. FIG. 17 illustrates the secondary solar panel embodiment 122 for the portable power unit embodiment 10.

The number of modules is growing with time as anything that requires electricity can potentially be turned into a module that can be used by the portable power unit 10 and/or the wall mount 48. By way of example, but in no way exhaustive, the following list includes some modules that can be used with the either embodiment of the instant invention: security motion detector module; fire starting module; cigarette lighter module; AM/FM radio module; mp3 module with built-in speaker; USB port module; super capacitor module for high voltage current devices which can be used as a stand alone during emergency power backup; multiplexer module for using several modules at a time; LED reading module; battery charging module for rechargeable AAA, AA and C batteries; slipper smart phone module; 12 vdc module; clock module with alarm, date, time and indoor temperature; solar panel module; and compass module. All modules and the power output units use PPTC electronic overload protection to keep them operating for decades, eliminating waste.

All modules 74 have magnetic contacts that are replaceable after heavy use. The same is true for the output modules on the wall mount embodiment 48 and the portable power unit 10. Each contact has a permanent magnet 68 with a secondary magnet 70 attached thereto magnetically that can be replaced as needed. A retaining ring 66 is housed around both magnets 70, 68 and the retaining ring 66, which also acts as a guard in the event of a drop, is secured in place by a screw 72. (See FIG. 12). Note that in FIG. 12, the screw 72 only penetrates the permanent magnet 68 and the face 54 of the wall mount embodiment 48. The retaining ring 66 is affixed to the removable magnet 70 magnetically. All modules 74 must be opposite magnetically but the same electrically as the output connectors they connect to in either the portable power unit 10 embodiment or the wall mount 48 embodiment.

5) The Specialized Module that is Used as a Super Capacitor Module with Adjustable Output Alluded to above was a special module 148 that is charged from a specific output point 132 on the portable power unit embodiment 10. This is the super capacitor module with adjustable output 148 and its powering discs 194 are shown schematically in FIGS. 20A-20M. This module 148 has a super capacity which allows it to be used as an emergency power back up and it does not need batteries to operate. To charge this module 148 on the portable power unit 10 outlet 132 for it, the power on/off switch on the portable power unit 10 must be off and the batteries 29 disabled to enable faster charging on the super capacity module with adjustable output 148. A secondary solar panel 122 can be used to speed up the charging of this module 148 along with the permanent solar panel 26. The output on the portable power unit 10 for this is constant at 4.8 vdc and does not vary.

The super capacitor module 148 provides higher voltages and higher amperage that the battery unit 29 within the portable power unit 10. The portable power unit 10 can obtain 1.2 vdc, 2.4 vdc and 4.8 vdc at 1000 ma max current, while the super capacitor module 148, once charged, can obtain 5 vdc, 12 vdc, and 19 vdc at 3000 ma max current. The super capacitor module 148 consists of four super capacitors rated at 2.7 vdc each, which then each consist of two capacitor banks, which is two capacitors in series. (See FIGS. 20A-20M).

The amperage select on the module 148 allows different coupling of the banks 190, 192 for higher voltage or higher amperage for the control board to work with. The voltage select on the super capacitor module 148 works by adjusting feedback to the control board via selection of different resistors by the voltage select position. The various resistors are contained within the unit. If the control board should fail in an emergency situation the input to the board C point 154A being positive and B point 152A being negative can be jumped to board F point 158B being positive and the board E point 158A being negative which will disable the voltage select and only allow the amperage select to vary the voltage based on coupling, which limits the module to 6 vdc or 12 vdc, which is one possible configuration for a second generation of super capacitor modules (See FIG. 20M). The super capacitor module 148 can also be charged remotely by using the extension cord 114 and the solar module 122 (See FIG. 17).

Figure 20A:
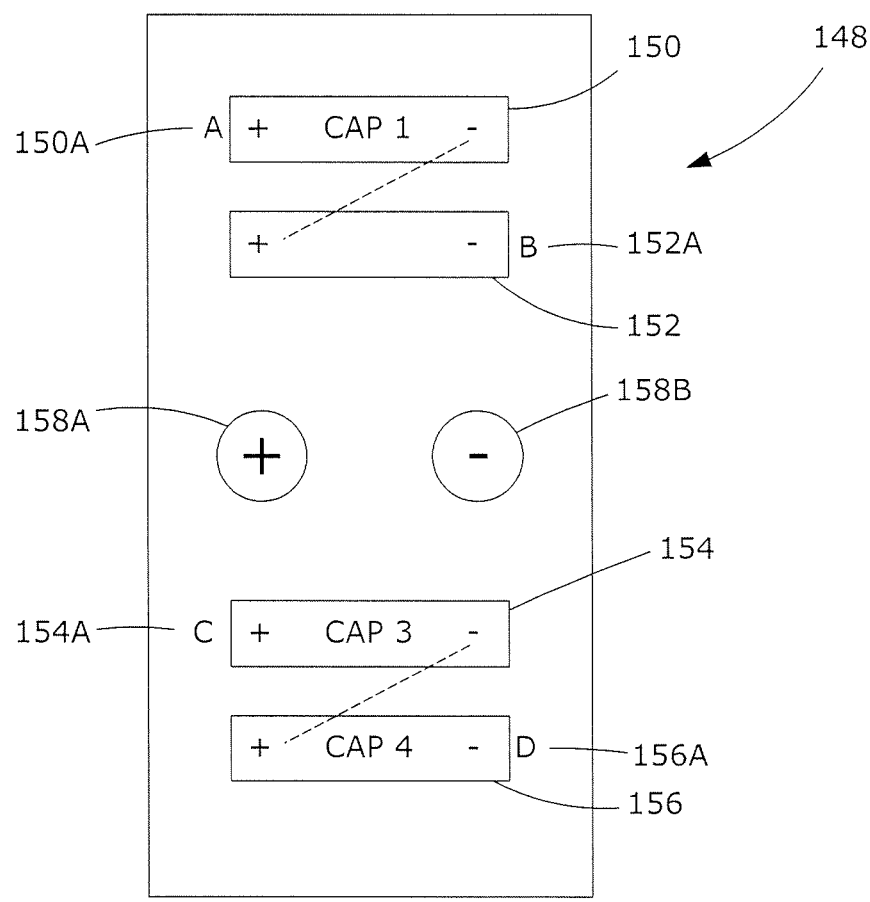
FIG. 20A is a front schematic view of the super capacitor module with adjustable output.
Figure 20B:
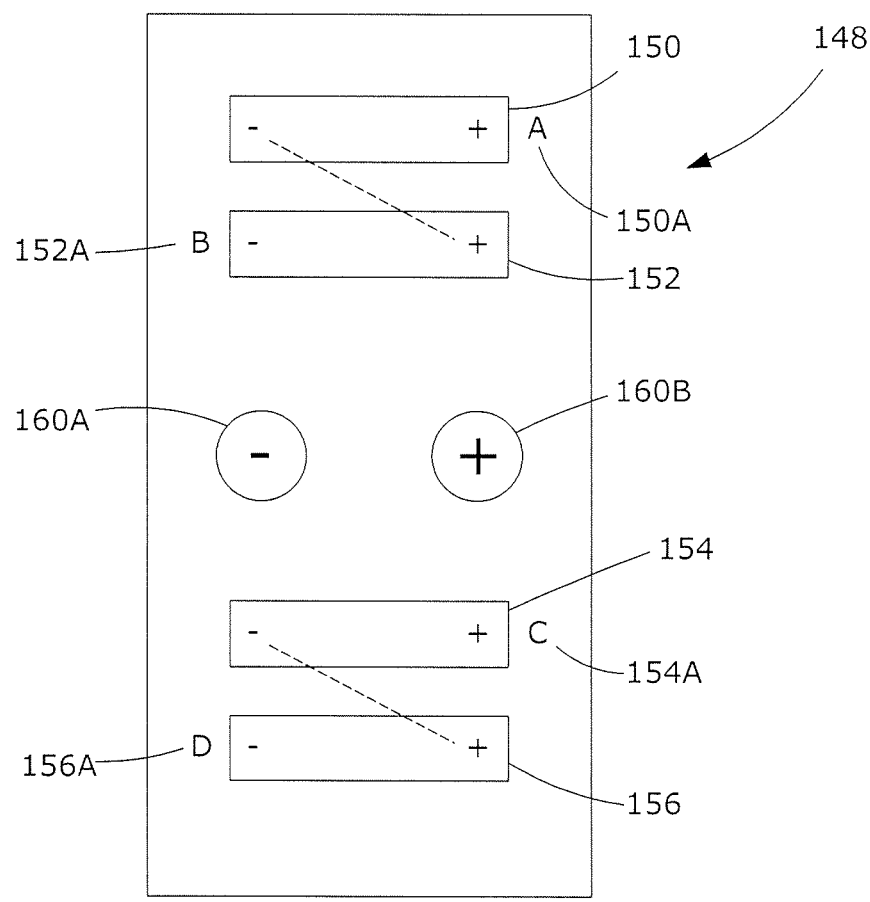
FIG. 20B is a back schematic view of the super capacitor module with adjustable output.

FIG. 20A illustrates schematically the front of the super capacitor module 148. The top section in FIGS. 20G, 20H, 20I illustrates the capacitor section area to be chosen by the disc. The super capacitor module 148 uses a control board within the module housing to supply voltage to output connections on the module. The control board output voltage varies depending on the selection of the voltage by switching between different resistors. The super capacitor module 148 can exchange available voltage when used together. When input connectors on the super capacitor module 148 are coupled with constant output connectors 132 on the portable power unit 10 used as stand alone, the input and output connectors can be used as a power supply due to the fact that connectors on the bottom bank 192 are always connected if the discs. In this case, 6 vdc is still available.

In FIGS. 20G, 20H, 20I we see the super capacitor 1 150 and its connection point A 150A. Connection point A is a magnet to the capacitor connection point. CAP1 is super capacitor 1. Likewise, super capacitor 2 152 is shown with its connection point B 152A, which is a magnet to super capacitor 1 CAP2. Likewise, super capacitor 3 154 is shown with its connection point C 154A, which is a magnet to super capacitor 3 CAP3. Likewise, super capacitor 4 156 is shown with its connection point D 156A, which is a magnet to super capacitor 4 CAP4.

Figure 20C:
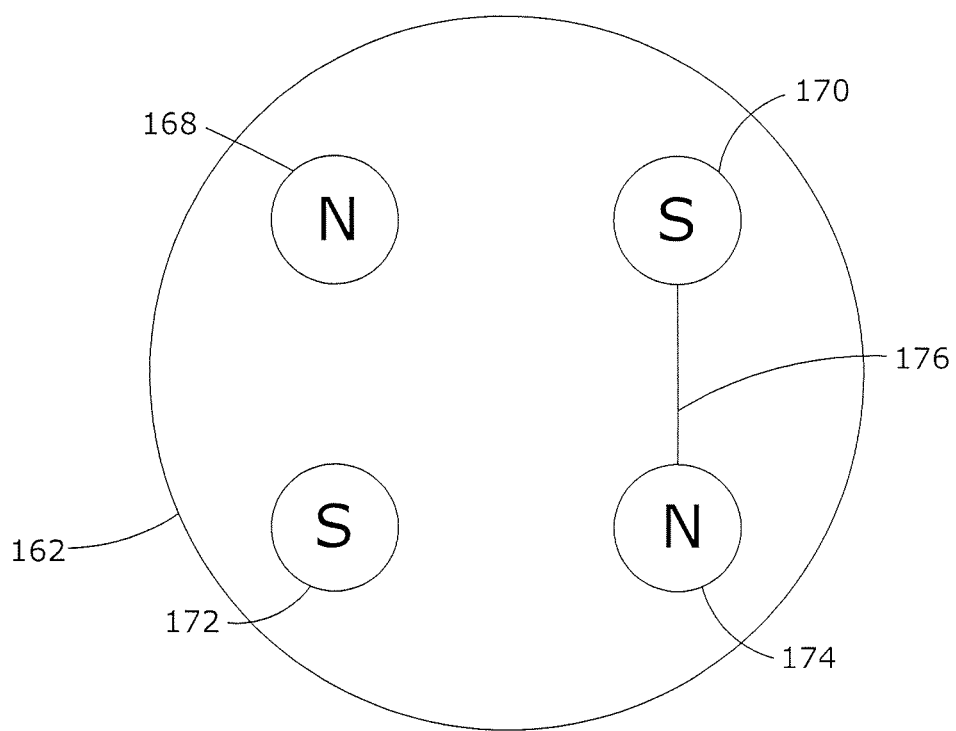
FIG. 20C is a front schematic view of the low amperage 6 vdc configuration for a switch for the super capacitor module with adjustable output.

FIGS. 20C, 20D, 20F, 20K, and 20L illustrate the various discs and how they operate. FIG. 20C shows the black disc 162 to be used with the super capacitor module 148, made of polyurethane, color coded black to provide 6 vdc low amperage. This disc has a top north pole magnetic polarity 168, a south pole top magnetic polarity 170, a south pole magnetic polarity bottom 172 below the top north pole and a bottom north pole magnetic polarity 174 below the south pole top magnetic polarity. The south pole top magnetic polarity 170 and the bottom north pole polarity are connected by a connector 176 closing the circuit.

Figure 20D:
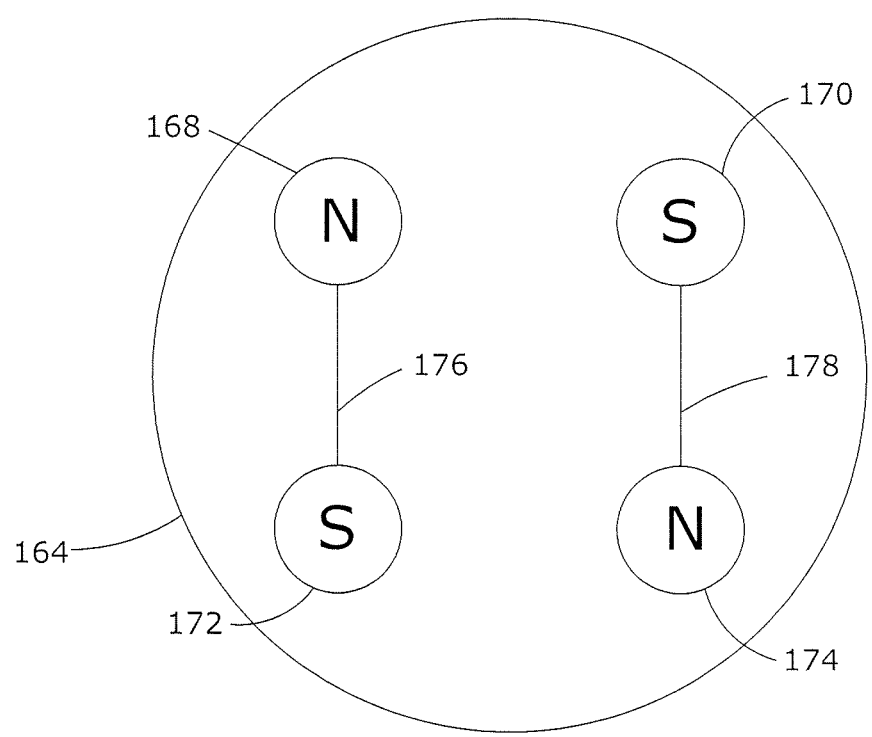
FIG. 20D is a front schematic view of the high amperage 6 vdc configuration for a switch for the super capacitor module with adjustable output.
Figure 20E:
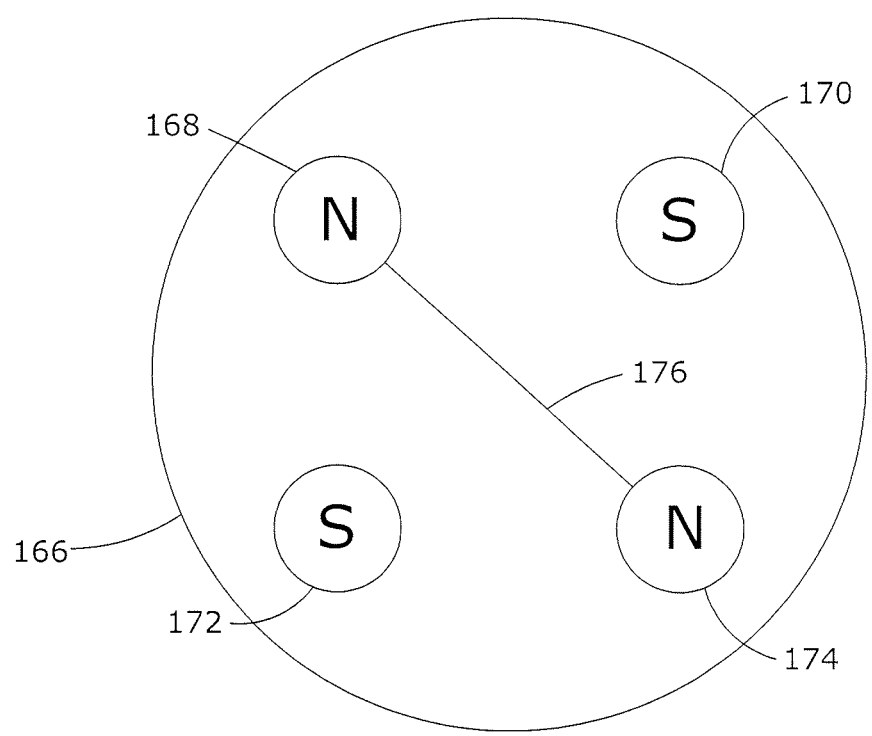
FIG. 20E is a front schematic view of the high amperage 12 vdc configuration for a switch for the super capacitor module with adjustable output.
Figure 20F:
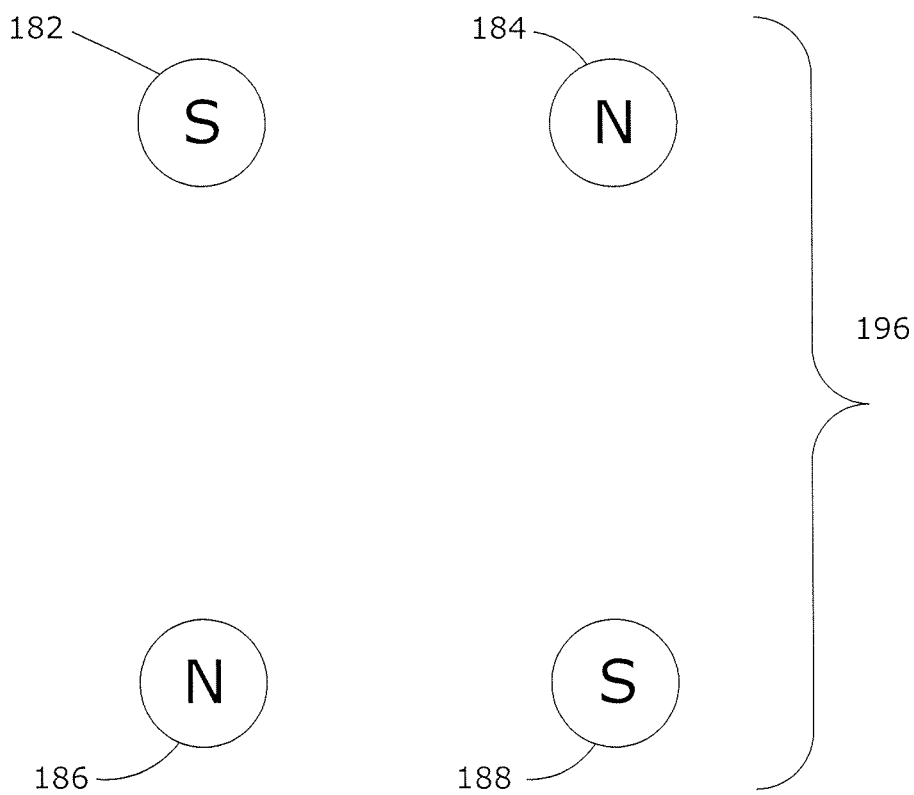
FIG. 20F is a schematic view of the amperage select outputs on the super capacitor module with adjustable output.
Figure 20G:
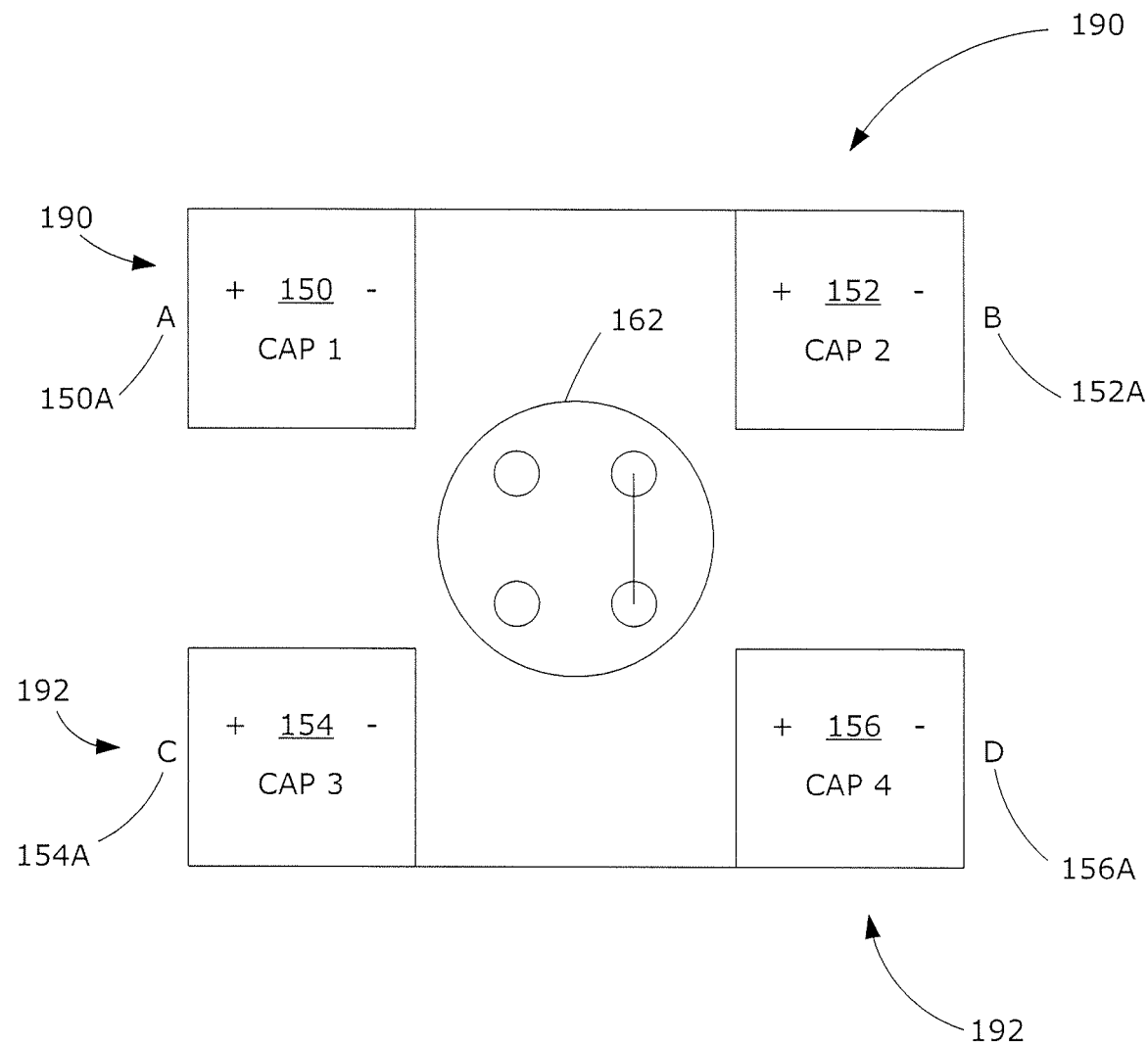
FIG. 20G is a schematic view of a disc for the super capacitor module with adjustable output with a jumper that connects B CAP2 negative and D CAP4 negative.
Figure 20H:
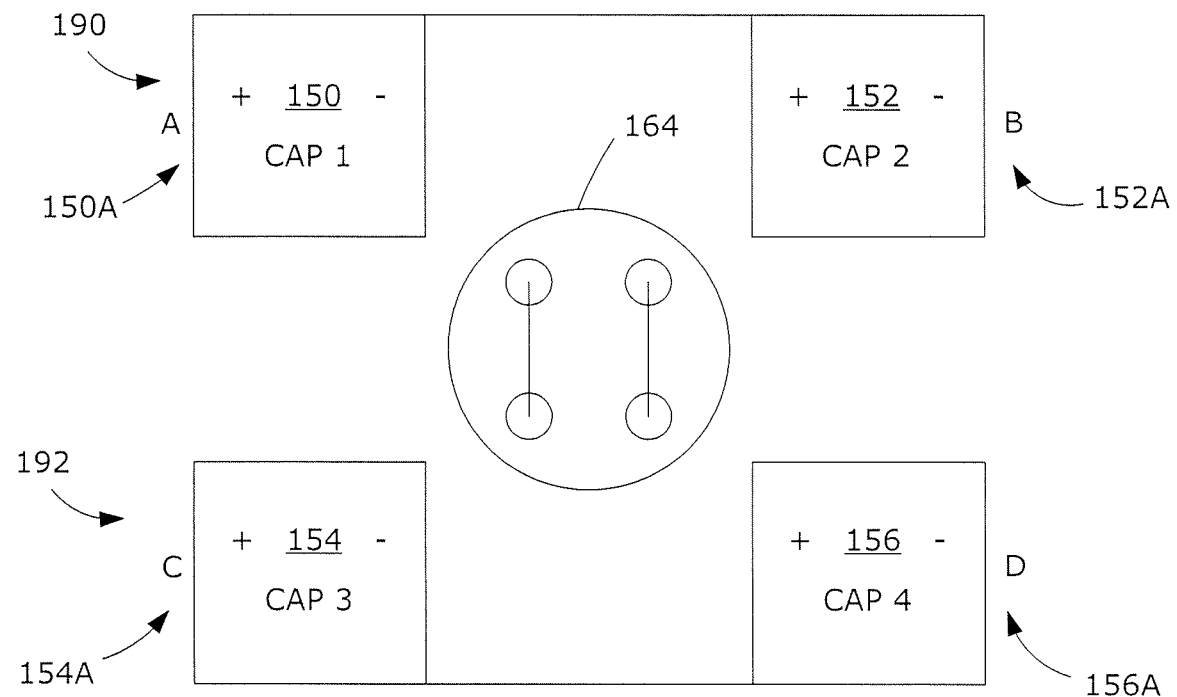
FIG. 20H is a schematic view of a disc for the super capacitor module with adjustable out put with a jumper that connects CAP1 positive to CAP3 positive and connects CAPS2 negative to CAP4 negative.
Figure 20I:
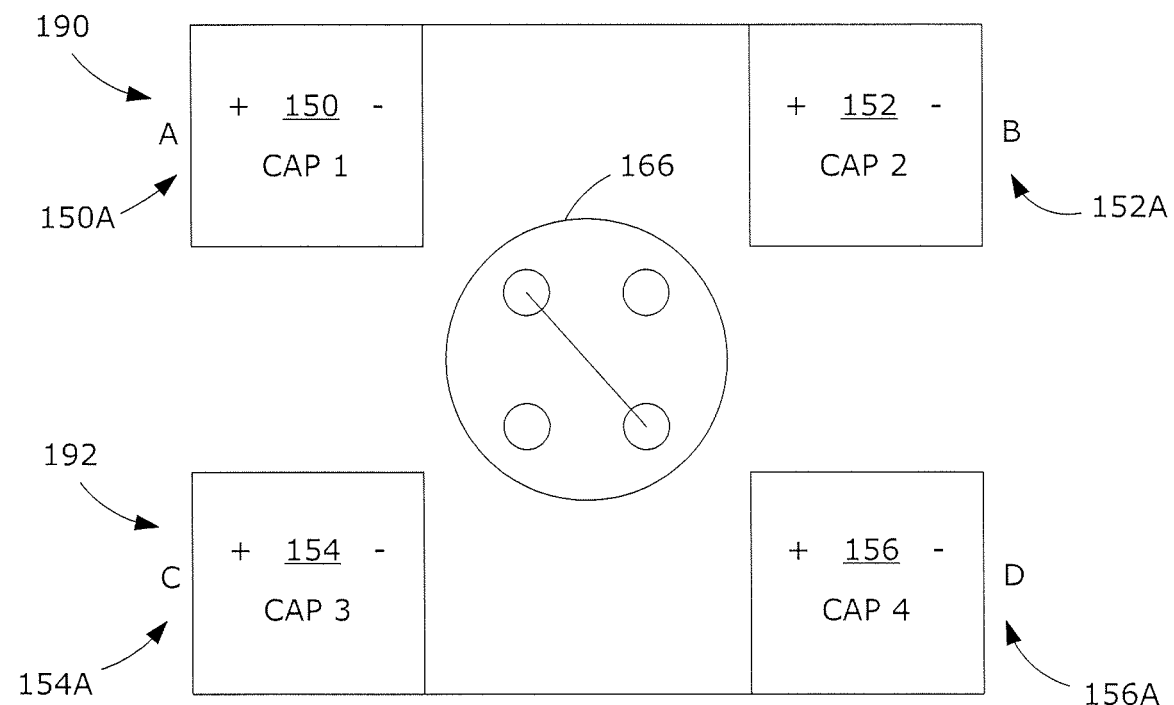
FIG. 20I is a schematic view of the top and bottom banks of the super capacitor module with adjustable output utilizing the high amperage 12 vdc configuration switch.
Figure 20J:
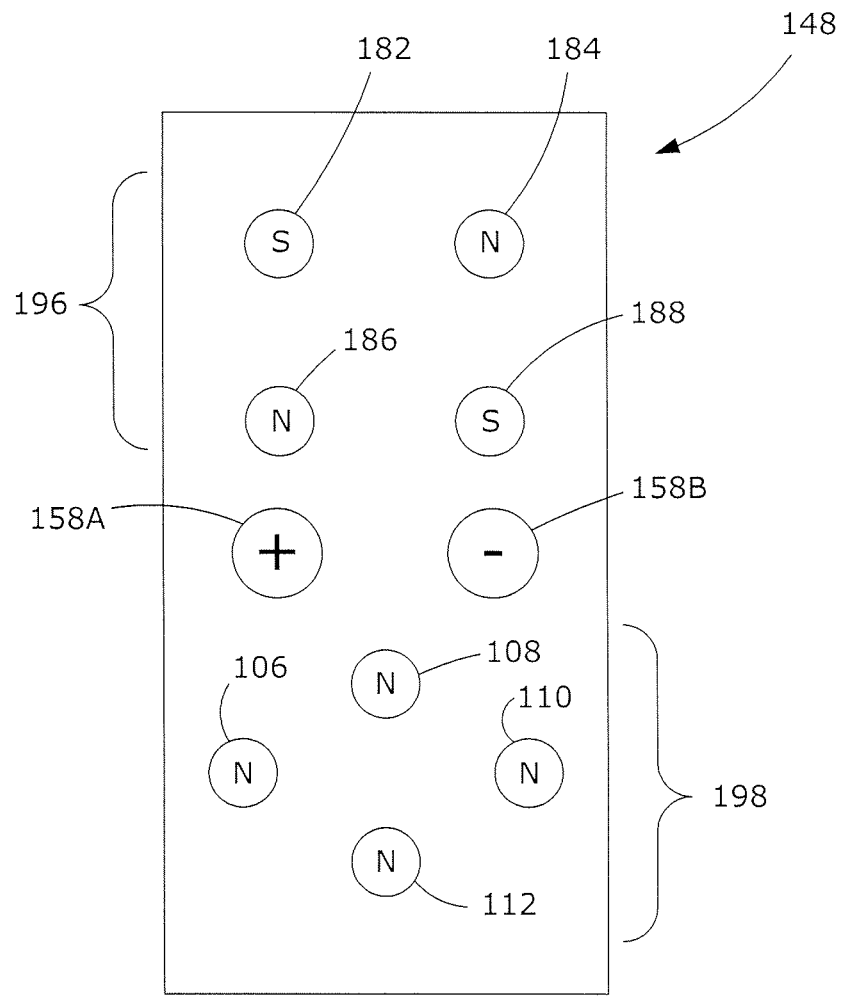
FIG. 20J is a front view of the super capacitor module with adjustable output showing the voltage select output and capacitor selectes.
Figure 20K:
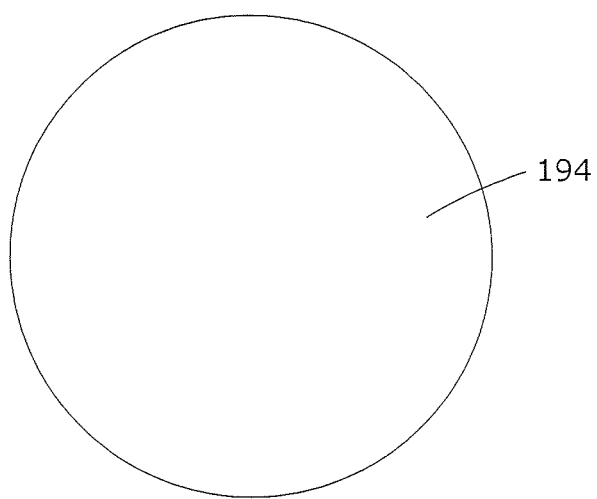
FIG. 20K is an illustrative disc to be used with the super capacitor module with adjustable output.
Figure 20L:
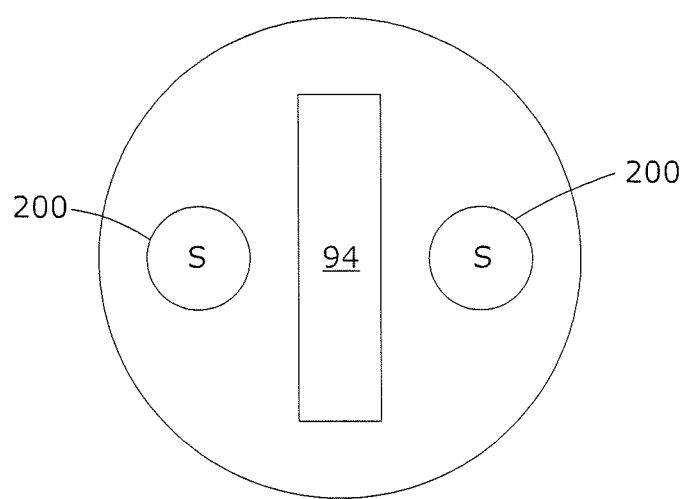
FIG. 20L is an illustrative disc lever side to be used with the super capacitor module with adjustable output.
Figure 20M:
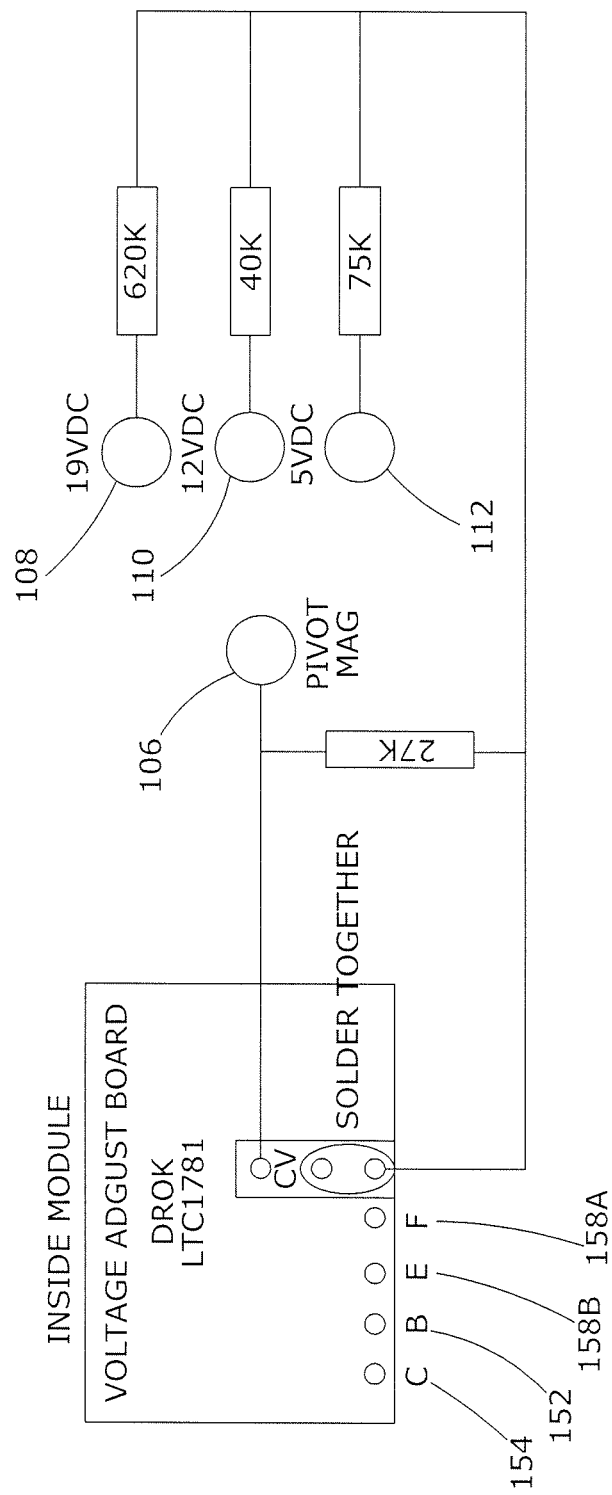
FIG. 20M is a schematic view of the inside of the super capacitor module with adjustable output.

FIG. 20D shows the 6 vdc high amperage green color coded disc 164. It is configured like the black disc 162 in 20C but with an additional connector connecting the other two magnetic polarities. FIG. 20E shows a third disc 166 that is color coded white and provides high amperage at 12 vdc. In this configuration, a single connector 176 connects the top north pole magnetic polarity 168 with the bottom north pole magnetic polarity 174. FIG. 20F illustrates the amperage select connections 196 with upper south pole magnet 182, upper north pole magnet 184, bottom north pole magnet 186 below the upper south pole and bottom south pole magnet 188 below the upper north pole magnet 184. FIG. 20K merely illustrates an illustrative disc 194, not defining it specifically as was done in FIGS. 20C, 20D and 20E. FIG. 20L shows the opposing side of a generic disc showing the handle 94 and both south pole magnets 200.

A black disc 162 (See FIG. 20C) uses the bottom bank 192 by changing magnetic polarity. It can now use both banks 190, 192 by placing it upside down giving the ability to use the top bank. The super capacity module 148 uses these three discs, 162. 164, 166 to select which capacitors are to be used when charging the module 148. Additionally, there is a voltage select that determines what voltage to send to the output connectors on the module 148. When no discs are used, the lower bank 192 only, which operates just like the portable power unit 10 except that the voltage comes from a voltage control board.

6) The Power on/Off Mechanism for the Portable Power Unit Embodiment

The power on/off mechanism 22 for the portable power unit 10 is seen in FIGS. 3 and 9. The on/off switch is a metal disc 88 with two south pole magnets 90, 92 and a lever handle 94 (See FIGS. 16C-16D). The on/off switch allows all power to be turned on or off.

The power on/off disc 88 pivots on the left magnet of the output 22 with a retainer to eliminate incorrect operation. The portable power unit 10 has two magnets that connect with the two magnets on the disc following the electrical and magnetic polarity principle that permeates the entire invention. The power on/off mechanism disconnects the battery power to the portable power unit 10.

7) Voltage Selector

The voltage select changes voltage to the output connectors 24 on the portable power unit 10 except for the constant output connectors 132 that remain at maximum voltage for charging of the cell phone slipper module 80 and the super capacitor module with adjustable voltage output 148. The voltage select changes voltage to the output connectors 24 only, not including the constant output connectors 132.

The voltage selector 88 on the portable power unit 10 works the same as the power on/off disc 88 except that there are four magnets 20 on the body 18 of the portable power unit 10 with one pivot magnet 106 being common (See FIGS. 4, 8, 16A-16D and 16G). Three additional magnets 108, 110, 112 are used for different voltages, 108 for high, 110 for medium and 112 for low or some similar logical configuration. Top magnet 108 is the high voltage of 4.8 volts, the middle magnet 110 is the medium voltage of 2.4 volts and the bottom magnet 112 is the low voltage of 1.2 volts. The voltage selector allows the portable power unit 10 to solar charge. It also varies the output to two outputs 24 that does not include the super capacitor outlet 132.

8) Amperage Selector

The amperage select provides a means of changing current available to the various screw-on heads only by changing disks, each with a different resistance based on the resistor on the disk that is coupled with a PPTC resistor that provides overcurrent protection.

Figure 4:
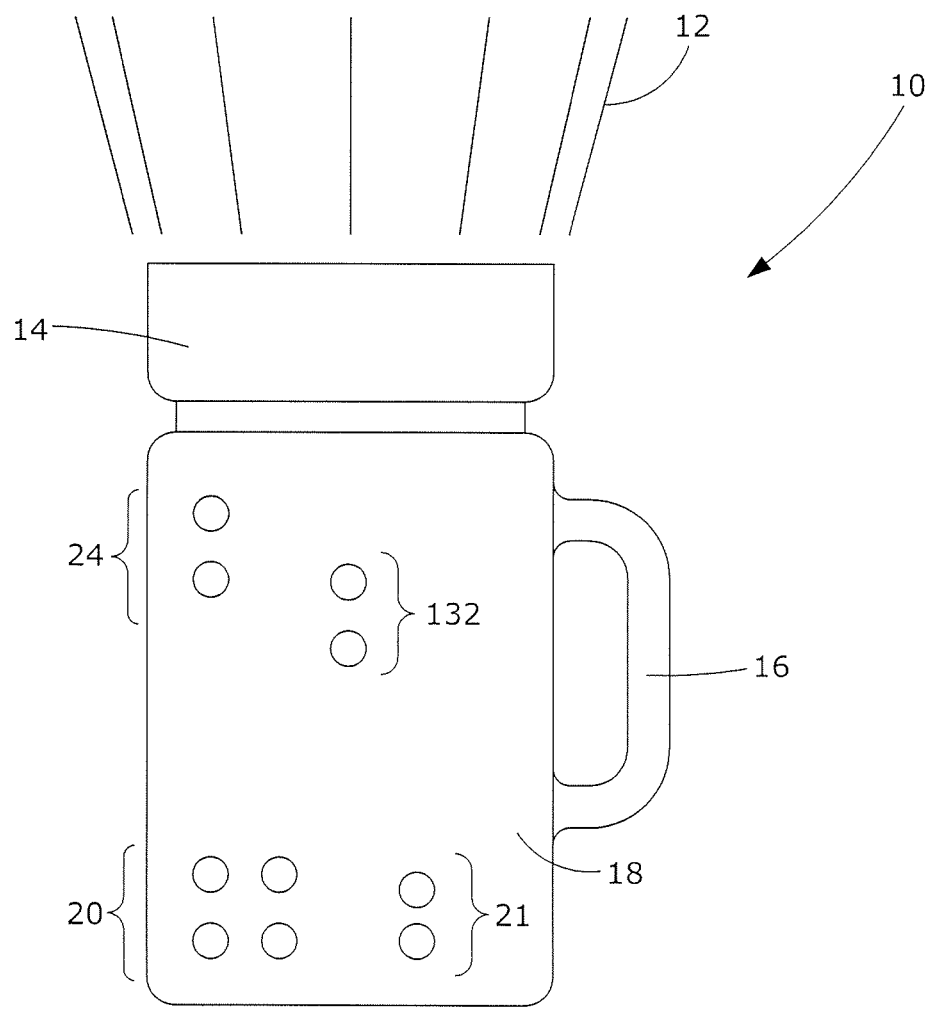
FIG. 4 is a second side view of the portable power device of the instant invention.
Figure 5:
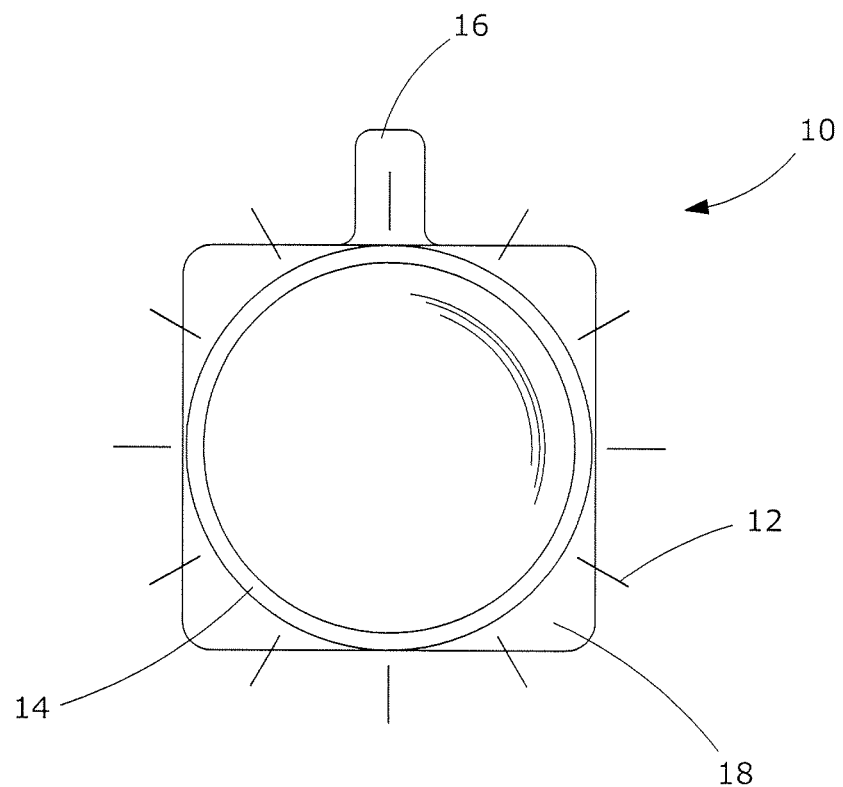
FIG. 5 is a front view of the portable power device of the instant invention.
Figure 6:
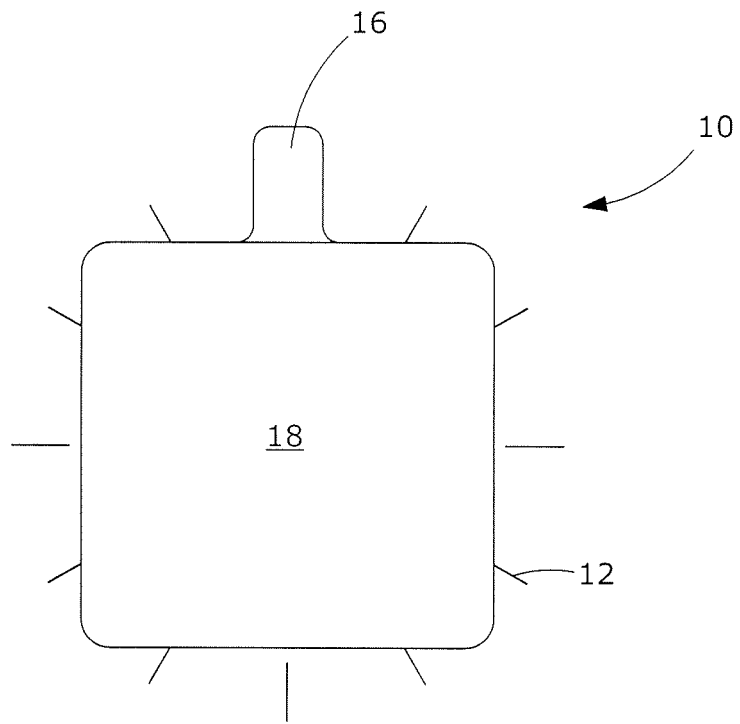
FIG. 6 is a rear view of the portable power device of the instant invention.
Figure 8:
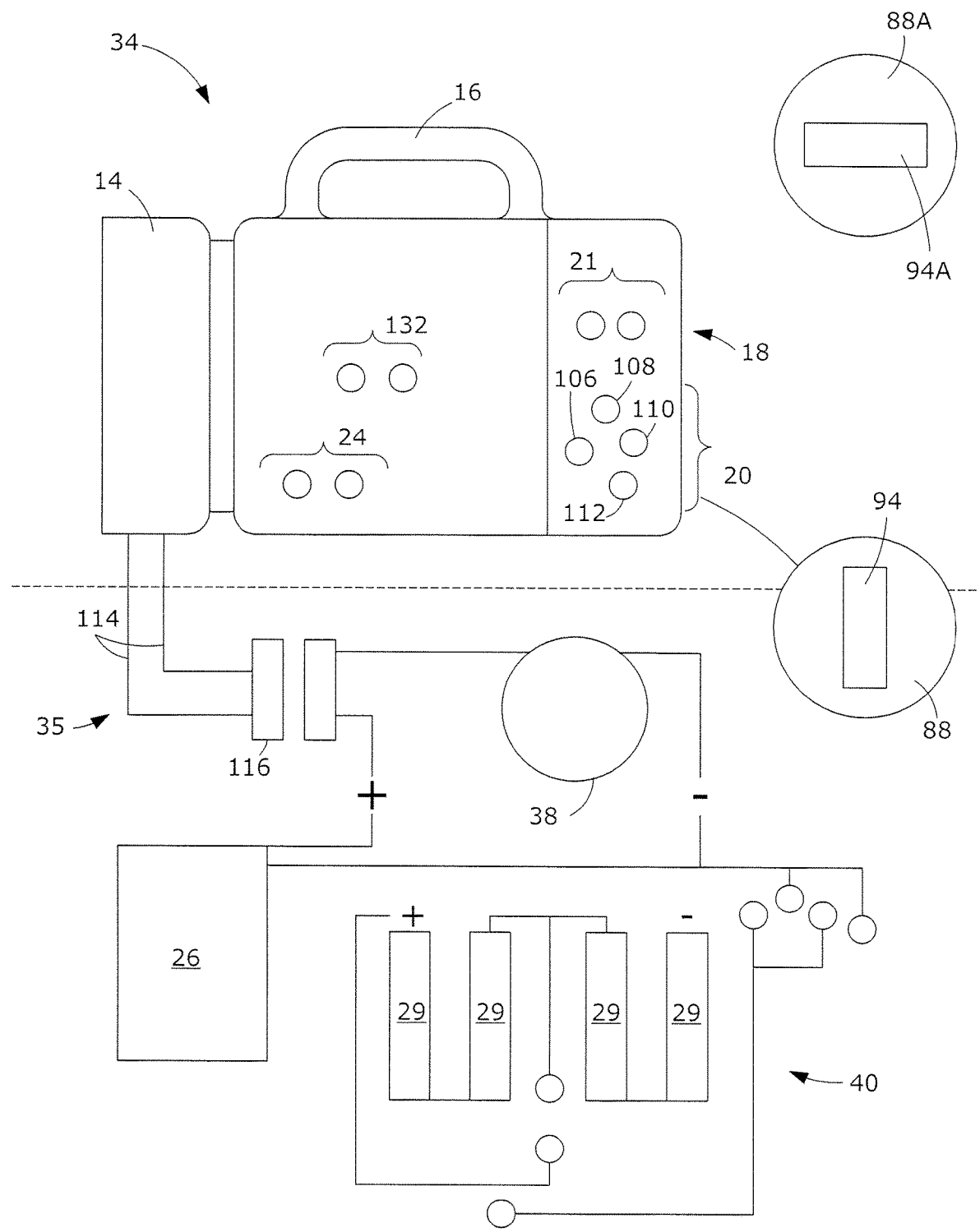
FIG. 8 is a schematic representation of the electronics and magnets in the second side of the portable power device of the instant invention.

The amperage selector 96 is very different from the power disc and the voltage selector. It is illustrated in FIGS. 4 and 8 as call out number 21 with regard to its output connection on the portable power unit 10. It is made of printed circuit board material and there are three separate discs 96 (See FIGS. 16E and 16F), one disc 96 for low amperage, one disc 96 for medium amperage and one disc 96 for high amperage. Each disc 96 is color coded and consists of a two-watt resistor and a PPTC overload chip 104. This is the dimming mechanism that allows for less power when using LEDs in the various heads 14 to vary the brightness of light 12 or the intensity of heat given out. This also provides on/off power to the heads 14.

Figure 16A:
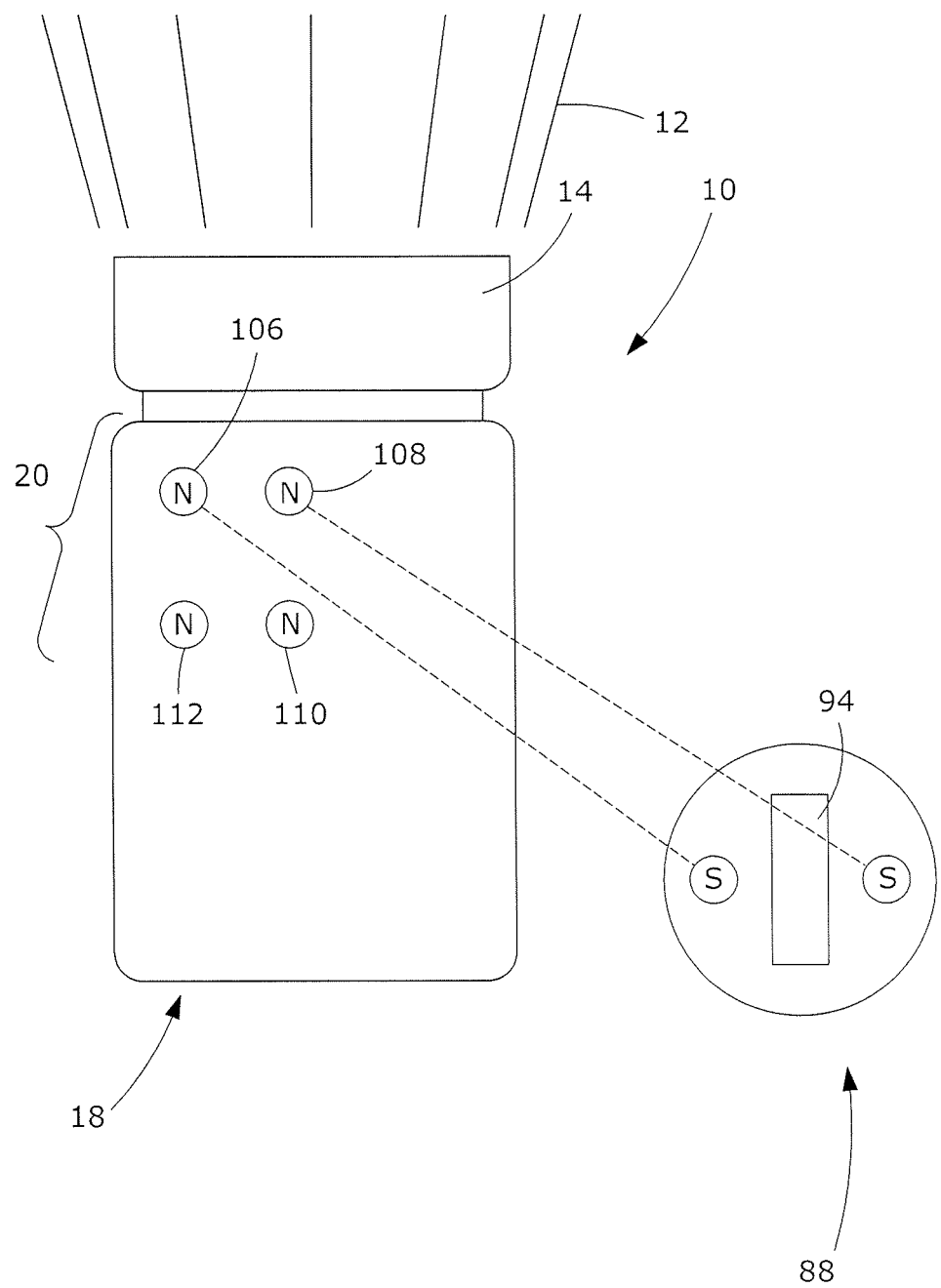
FIG. 16A is a top view of the portable power device embodiment of the instant invention with the voltage select switch in the high voltage position.
Figure 16B:
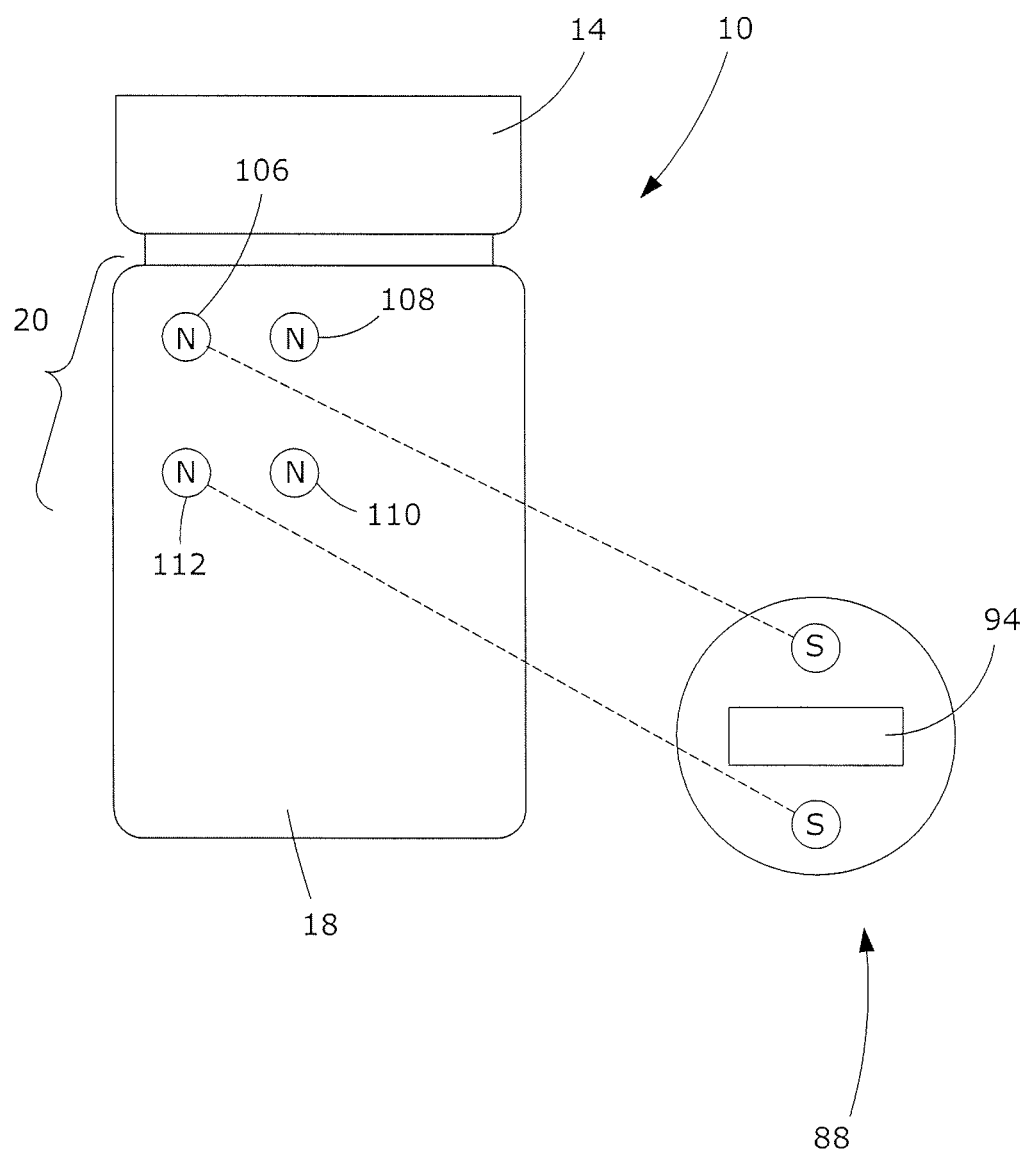
FIG. 16B is a top view of the portable power device embodiment of the instant invention with the voltage select switch in the low voltage position.
Figure 16C:
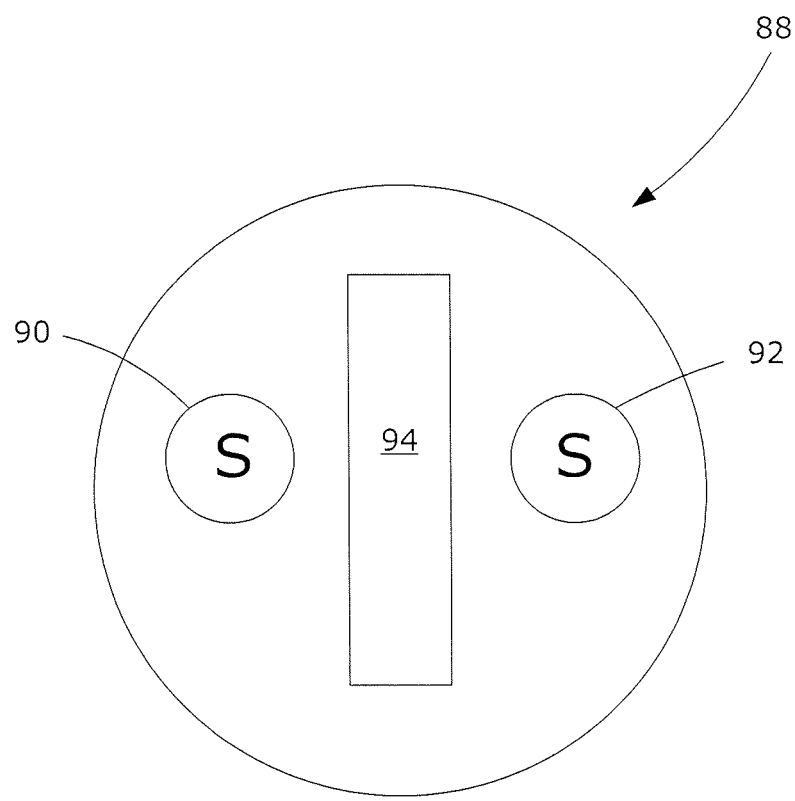
FIG. 16C is a front side view of the voltage select switch for the portable power device embodiment of the instant invention.
Figure 16D:
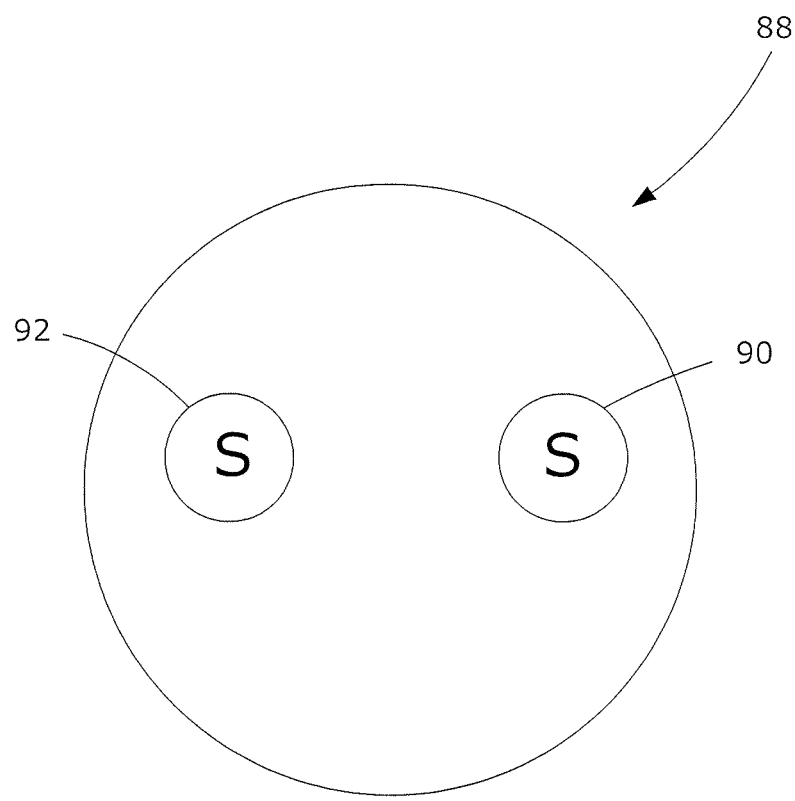
FIG. 16D is a back side view of the voltage select switch of the portable power device embodiment of the instant invention.
Figure 16E:
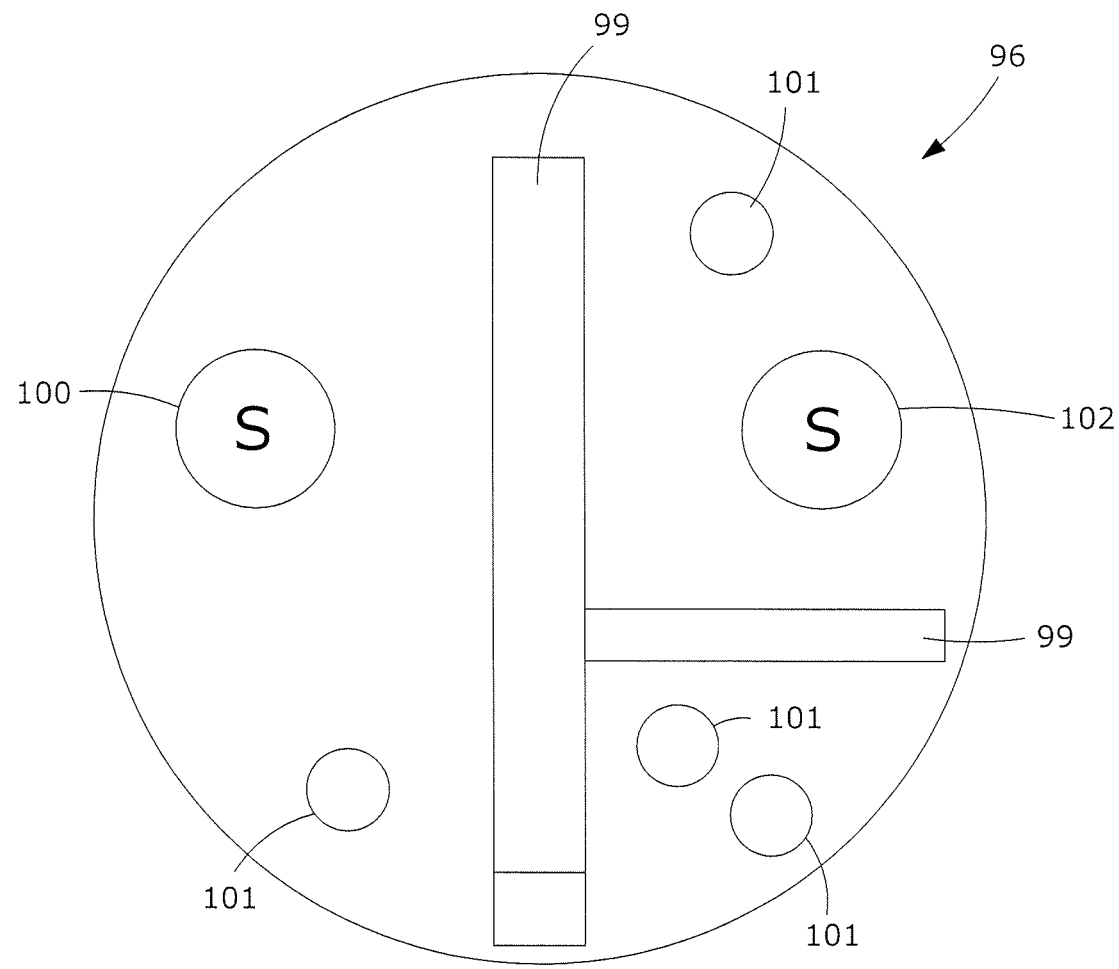
FIG. 16E is a back side view of the PPTC dimming disk for the portable power device embodiment of the instant invention.
Figure 16F:
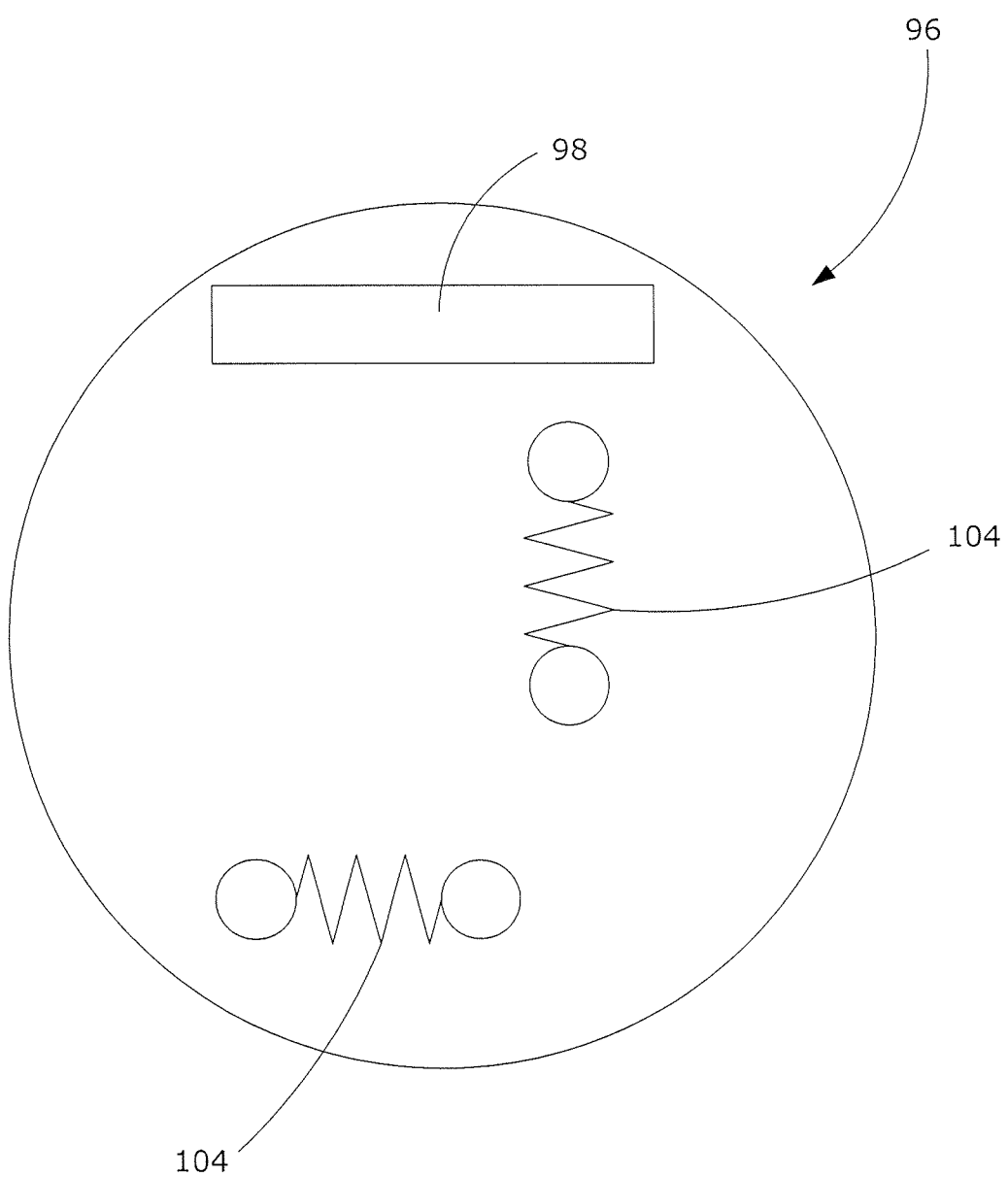
FIG. 16F is a front side view of the PPTC dimming disk for the portable power device embodiment of the instant invention.
Figure 16G:
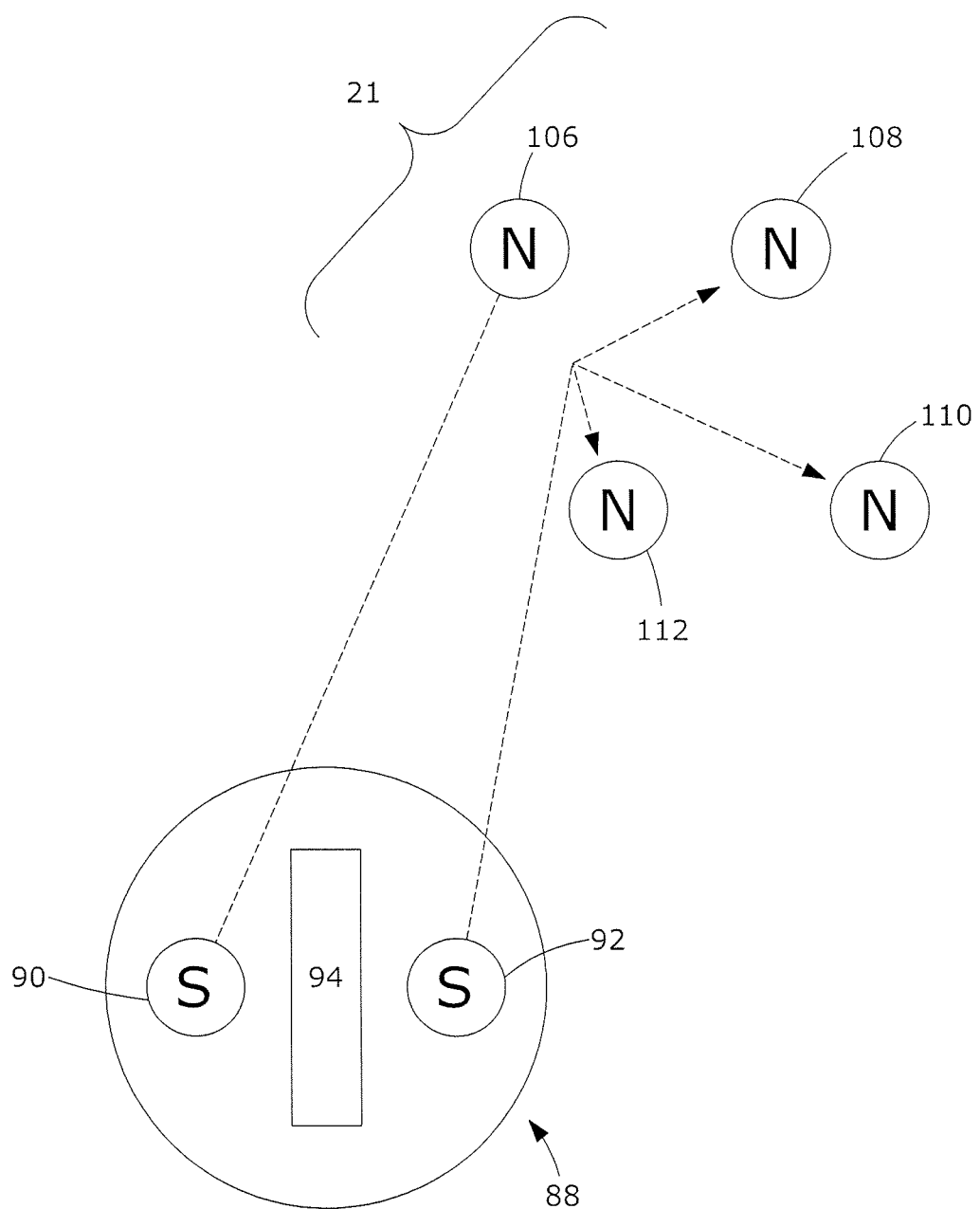
FIG. 16G is a close up view of the voltage select switch proximate the four magnet configuration on the portable power device embodiment of the instant invention.

FIG. 16E shows the back side of the dimming disk 96 for the amperage selector. It includes copper etched away points 99 and solder joints 101 with the south pole magnets 102. FIG. 16F shows the front side of the disc 96 where the resistors are shown 104 along with the handle 98.

9) The Wall Mount Embodiment

The wall mount embodiment is illustrated in FIGS. 10-13B, 15A-15B and 19. The wall mount embodiment 48 utilizes the same connection principle described above. It is essentially a stand alone set of four magnetic connectors 56A, 56B, 56C, 56D on a face 54 that attaches to a wall 52 with double-sided tape 50 between the face 54 and the wall 52. A steel cable 58 connects the electronics in the wall mount 48 to a plug 60 that receives energy from a wall outlet 62. An LED light 65 emanates from the face 54 to provide illumination in the dark. Slave units may also be hooked up to the single unit 48 using a USB power link 64 attached to the unit 48 that connect to additional until (See FIG. 19).

There is no on/off switch for the wall mounted unit 48 because it is powered by electricity through the steel cable and is activated when a module 74 is attached in the ON horizontal position (See FIG. 15A). Even when the module 74 is in the OFF position (See FIG. 15B), the LED light 65 remains illuminated to act as an night light or for ease of finding in the dark. One thing that distinguishes the outputs on the wall mount embodiment 48 from the portable power unit embodiment 10 is the existence of the second lower set of magnets 56C, 56D that are not electrically charged that allow for the modules 72 to stay in place in the vertical off position (See FIG. 15B). The wall mount embodiment 48 also has PPTC solid state overcurrent protection to avoid possible fire hazards.

Figure 19:
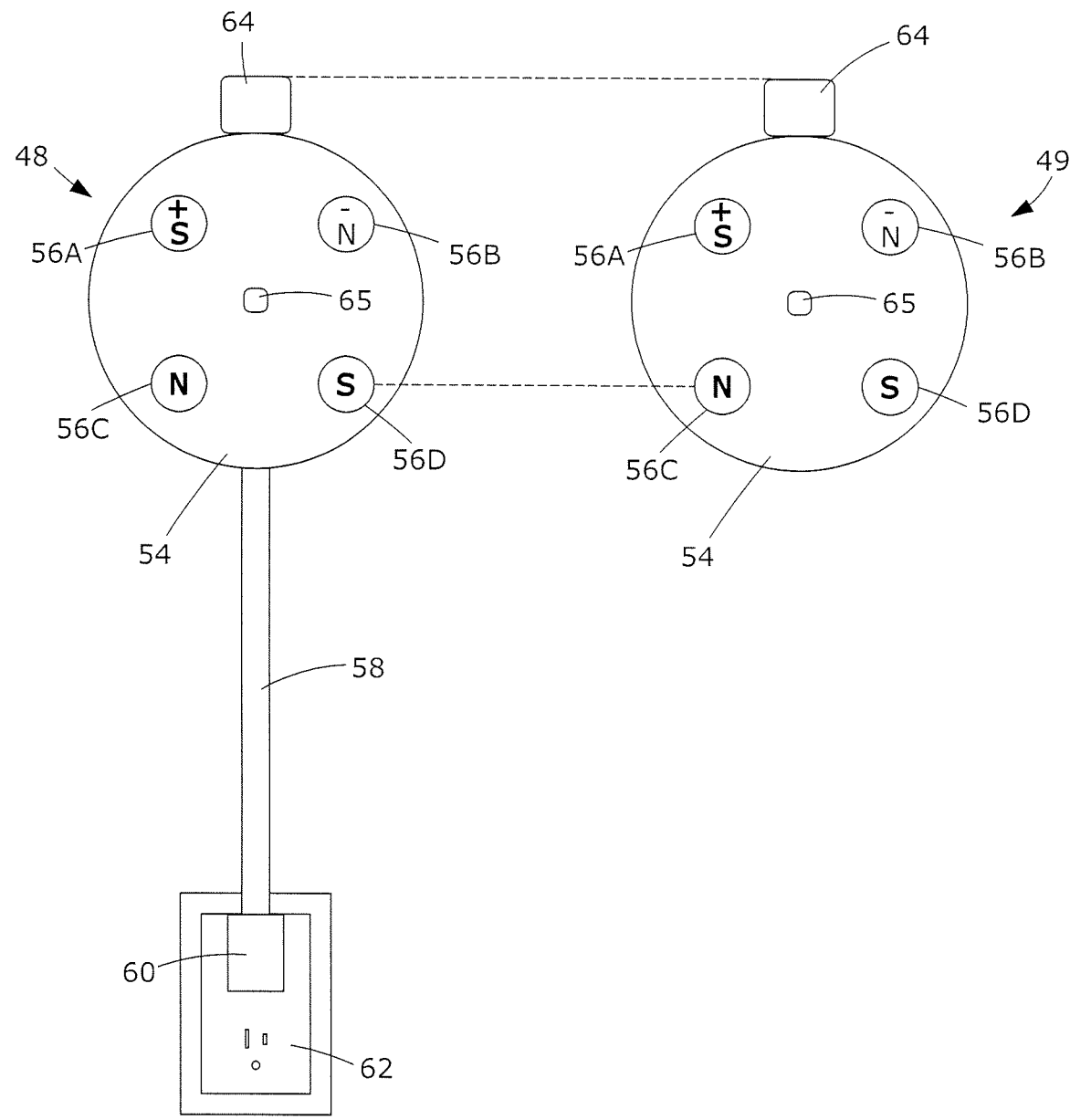
FIG. 19 is a schematic representation of the slave power link aspect of the wall mount embodiment of the instant invention.

Up to three slave units can be linked with the power link jumper 142 mechanism shown in FIG. 19. Male to male USB connections can made with the power link 64.

The invention illustratively disclosed herein suitably may be practiced in the absence of any element which is not specifically disclosed herein.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

What is claimed is:

1. An electrical connection system comprising:
   a first output array from a power source wherein said output array includes a first connector that is positively electrically charged and contains a south pole magnet and a second connector that is negatively electrically charged and contains a north pole magnet wherein said first connector and said second connector are parallel and proximate each other wherein at least one of said south pole magnet and said north pole magnet on said output array is equipped with one or more protective retaining rings that surround said at least one of said south pole magnet and said north pole magnet on said output array;
   a second output array positioned directly below said first output array wherein said second array contains a second north pole magnet that is not electrically charged positioned directly below said first connector and a second south pole magnet that is not electrically charged is positioned directly below said second connector;
   an input array on a modular device, said modular device needing electricity to operate wherein said input array includes a first connector that is positively electrically charged and contains a north pole magnet to connect with said first connector on said output array and a second connector that is negatively electrically charged and contains a south pole magnet to connect with said second connector on said output array wherein said one or more protective retaining rings provides strength to said at least one of said south pole magnet and said north pole magnet on said output array that prevents shear and separation when connected to said input array;
   wherein when said modular device requiring electricity to operate is positioned and magnetically attached in a horizontal direction across said first output array, electrical current passes therethrough energizing said modular device and when said modular device is positioned in a vertical position across said first output array and said second output array, no electrical current passes therethrough and said modular device is not energized wherein said modular device toggles between being charged and being non-charged through a rotational movement of said modular device across said first output array between said horizontal and vertical directions.

2. The electrical connection system as defined in claim 1 wherein said modular device is taken from the group comprising: security motion detector module; fire starting module; cigarette lighter module; AM/FM radio module; mp3 module with built-in speaker; USB port module; super capacitor module for high voltage current devices which can be used as a stand alone during emergency power backup; multiplexer module for using several modules at a time; LED reading module; battery charging module for rechargeable AAA, AA and C batteries; slipper smart phone module; 12 vdc module; clock module with alarm, date, time and indoor temperature; solar panel module; and compass module.

3. The electrical connection system as defined in claim 1 wherein said output connectors are affixed to a wall mounted device that is connected via a cable to electricity via electrical outlet.

4. The wall mounted device as defined in claim 3 wherein an LED light is affixed to said wall mounted device.

5. The wall mounted device as defined in claim 3 wherein a power link connector is affixed to said wall mounted device to allow connection to further wall mounted devices.

6. The electrical connection system device as defined in claim 1 wherein power is provided to said output connectors through a portable device wherein said output connectors are affixed to said portable device and rechargeable batteries are housed in the interior of said portable device wherein said batteries are solar powered and wherein said portable device further comprises a removable head that is powered by said rechargeable batteries wherein said removable head is attached to an extension cord, said extension cord containing an input array that remains attached to said portable device.

7. The removable head as defined in claim 6 wherein the types of removable heads are taken from the group comprising: an LED lantern; red LED lights to provide light for night hunting or to speed up the healing of wounds; UVC LED lights to be used along with a stainless steel dish into which water can be contained wherein the UVC LED lights are used to sterilize the water; LED light heads to warm up foods and liquids; a fan head; a black LED light head; and a facial LED module for wrinkle reduction.

8. An electrical connection system comprising:
   an output array from a power source wherein said output array includes a first connector that is positively electrically charged and contains a south pole magnet and a second connector that is negatively electrically charged and contains a north pole magnet;
   an input array on a modular device, said modular device needing electricity to operate wherein said input array includes a first connector that is positively electrically charged and contains a north pole magnet to connect with said first connector on said output array and a second connector that is negatively electrically charged and contains a south pole magnet to connect with said second connector on said output array wherein power is provided to said output connectors through a portable device wherein said output connectors are affixed to said portable device and rechargeable batteries are housed in the interior of said portable device wherein said batteries are solar powered and wherein said portable device further comprises a removable head that is powered by said rechargeable batteries wherein said removable head is attached to an extension cord, said extension cord containing an input array that remains attached to said portable device wherein further output connectors provide non-battery charging for a super capacity module that allows said portable device to be used as an emergency power back up and not requiring batteries to operate that includes adjustable output wherein specialized discs are provided to adjust amperage and voltage and to power the portable device on and off and that provides for power applications suitable up to 50 amps DC voltage.

* * * * *